(12) United States Patent
Seo et al.

(10) Patent No.: US 12,183,402 B2
(45) Date of Patent: Dec. 31, 2024

(54) OPERATION METHOD OF MEMORY DEVICE, AND OPERATION METHOD OF MEMORY CONTROLLER CONTROLLING MEMORY DEVICE

(71) Applicant: Samsung Electronics Co., Ltd., Suwon-si (KR)

(72) Inventors: Jun-Ho Seo, Hwaseong-si (KR); Yong-Wan Son, Hwaseong-si (KR); Dogyeong Lee, Suwon-si (KR); Youngha Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 111 days.

(21) Appl. No.: 18/063,912

(22) Filed: Dec. 9, 2022

(65) Prior Publication Data
US 2023/0215501 A1 Jul. 6, 2023

(30) Foreign Application Priority Data
Jan. 3, 2022 (KR) .................. 10-2022-0000463

(51) Int. Cl.
*G11C 16/04* (2006.01)
*G11C 16/10* (2006.01)
*G11C 16/16* (2006.01)
*G11C 16/34* (2006.01)

(52) U.S. Cl.
CPC ............ *G11C 16/16* (2013.01); *G11C 16/102* (2013.01); *G11C 16/3445* (2013.01)

(58) Field of Classification Search
CPC ........................................................ G11C 16/16
USPC ....................................................... 365/185.29
See application file for complete search history.

(56) References Cited

U.S. PATENT DOCUMENTS

| 8,755,227 | B2 | 6/2014 | Lin et al. |
| 8,861,282 | B2 | 10/2014 | Dutta et al. |
| 8,913,432 | B2 | 12/2014 | Dong et al. |
| 9,589,640 | B2 * | 3/2017 | Moon ............ G11C 16/26 |
| 9,627,084 | B2 * | 4/2017 | Kwak ........... G11C 16/3459 |
| 10,573,388 | B2 | 2/2020 | Gupta et al. |
| 10,636,492 | B2 | 4/2020 | Baek et al. |
| 10,923,195 | B2 * | 2/2021 | Bae ............. G11C 16/0483 |

* cited by examiner

*Primary Examiner* — Hoai V Ho
(74) *Attorney, Agent, or Firm* — HARNESS, DICKEY & PIERCE, P.L.C.

(57) ABSTRACT

Disclosed is an operation method of a memory device that includes a memory block including a plurality of cell transistors stacked in a direction perpendicular to a substrate. The plurality of cell transistors may include a ground selection transistor and an erase control transistor. The erase control transistor may be between the substrate and the ground selection transistor. The operation method may include performing a first erase operation on the ground selection transistor, performing a first program operation on the erase control transistor after the first erase operation, performing a second program operation on the ground selection transistor after the first program operation, and performing a second erase operation on the erase control transistor after the second program operation.

20 Claims, 20 Drawing Sheets

FIG. 7

[Erase on GST]

| BLK | GST ESR | GST ESR VFY |
|---|---|---|
| ECL2 | V2 FLT | VON1 |
| SSL1u | V1 FLT | VON1 |
| SSL1d | V1 FLT | VON1 |
| DWL2 | FLT | VON1 |
| WLs | FLT | VON1 |
| DWL1 | FLT | VON1 |
| GSL1 | VERS_WL | VVFY1 |
| ECL1 | VERS_WL | VVFY1 |

[Program on ECT]

| BLK | ECT PGM | ECT PGM VFY |
|---|---|---|
| ECL2 | VPASS2 | VON3 |
| SSL1u | VPASS2 | VON3 |
| SSL1d | VPASS2 | VON3 |
| DWL2 | VPASS1 | VON2 |
| WLs | VPASS1 | VON2 |
| DWL1 | VPASS1 | VON2 |
| GSL1 | VPGM1 | VVFY2 |
| ECL1 | | |

[Program on GST]

| BLK | GST PGM | GST PGM VFY |
|---|---|---|
| ECL2 | VPASS2 | VON3 |
| SSL1u | VPASS2 | VON3 |
| SSL1d | VPASS2 | VON3 |
| DWL2 | VPASS1 | VON2 |
| WLs | VPASS1 | VON2 |
| DWL1 | VPASS1 | VON2 |
| GSL1 | VPGM2 | VVFY3 |
| ECL1 | VOFF1 | VON2 |

[Erase on ECT]

| BLK | ECT ERS | ECT ERS VFY |
|---|---|---|
| ECL2 | V2 FLT | VON1 |
| SSL1u | V1 FLT | VON1 |
| SSL1d | V1 FLT | VON1 |
| DWL2 | FLT | VON1 |
| WLs | FLT | VON1 |
| DWL1 | FLT | VON1 |
| GSL1 | FLT | VON1 |
| ECL1 | VERS_WL | VVFY4 |

OPERATION METHOD OF MEMORY DEVICE, AND OPERATION METHOD OF MEMORY CONTROLLER CONTROLLING MEMORY DEVICE

CROSS-REFERENCE TO RELATED APPLICATIONS

This application claims priority under 35 U.S.C. § 119 to Korean Patent Application No. 10-2022-0000463, filed on Jan. 3, 2022 in the Korean Intellectual Property Office, the entire disclosures of which is incorporated by reference herein.

BACKGROUND

Embodiments of the present disclosure described herein relate to a semiconductor memory, and more particularly, relate to an operation method of a memory device, and/or an operation method of a memory controller controlling the memory device.

A semiconductor memory device may be classified as a volatile memory device, in which stored data disappears when a power supply is turned off, such as a static random access memory (SRAM) or a dynamic random access memory (DRAM); or a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM).

A flash memory device stores data by controlling threshold voltages of cell transistors. The threshold voltages of the cell transistors may vary due to various factors; in this case, the reliability of operation of the flash memory device may decrease.

SUMMARY

Embodiments of the present disclosure provide an operation method of a memory device with improved reliability and/or an operation method of a memory controller controlling the memory device.

According to an embodiment, an operation method of a memory device that includes a memory block including a plurality of cell transistors stacked in a direction perpendicular to a substrate is provided. The plurality of cell transistors may include a ground selection transistor and an erase control transistor. The erase control transistor may be between a substrate and the ground selection transistor. The operation method may include performing a first erase operation on the ground selection transistor; after the first erase operation, performing a first program operation on the erase control transistor; after the first program operation, performing a second program operation on the ground selection transistor; and after the second program operation, performing a second erase operation on the erase control transistor.

According to an embodiment, an operation method of a memory device that includes a memory block including a plurality of lines stacked in a direction perpendicular to a substrate is provided. The operation method may include applying a first erase voltage to a common source line and applying a first word line erase voltage to a ground selection line of the plurality of lines, the plurality of lines including the ground selection line and an erase control line, the erase control line between the ground selection line and the substrate; applying a first erase verify voltage to the ground selection line; applying a first program voltage to the erase control line; applying a first program verify voltage to the erase control line; applying a second program voltage to the ground selection line; applying a second program verify voltage to the ground selection line; applying a second erase voltage to the common source line and applying a second word line erase voltage to the erase control line; and applying a second erase verify voltage to the erase control line.

According to an embodiment, an operation method of a memory controller is provided. The memory controller may be configured to control a memory device including a plurality of cell transistors stacked in a direction perpendicular to a substrate. The operation method may include sending a first command to the memory device using the memory controller, the first command for controlling the memory device to perform a cell-counting operation associated with ground selection transistors of the plurality of cell transistors; receiving a cell-counting result for the ground selection transistors, the memory controller receiving the cell-counting result from the memory device; and performing a distribution enhancement operation on the ground selection transistors based on the cell-counting result. The distribution enhancement operation may include sending a first erase command to the memory device using the memory controller, the first erase command for controlling the memory device to erase the ground selection transistors of the memory device; sending a first program command to the memory device using the memory controller, the first program command for controlling the memory device to program erase control transistors, the erase control transistors between the ground selection transistors and the substrate of the memory device, the plurality of cell transistors including the ground selection transistors and the erase control transistors; sending a second program command to the memory device using the memory controller, the second program command for controlling the memory device to program the ground selection transistors of the memory device; and sending a second erase command to the memory device using the memory controller, the second erase command for controlling the memory device to erase the erase control transistors of the memory device.

BRIEF DESCRIPTION OF THE FIGURES

The above and other objects and features of the present disclosure will become apparent by describing in detail embodiments thereof with reference to the accompanying drawings.

FIG. 7 is a diagram illustrating a bias condition associated with each operation described with reference to the flowchart of FIG. 6.

DETAILED DESCRIPTION

Below, embodiments of the present disclosure may be described in detail and clearly to such an extent that an ordinary of one skill in the art could make, use, and practice embodiments of inventive concepts in the present application.

Figure 1:
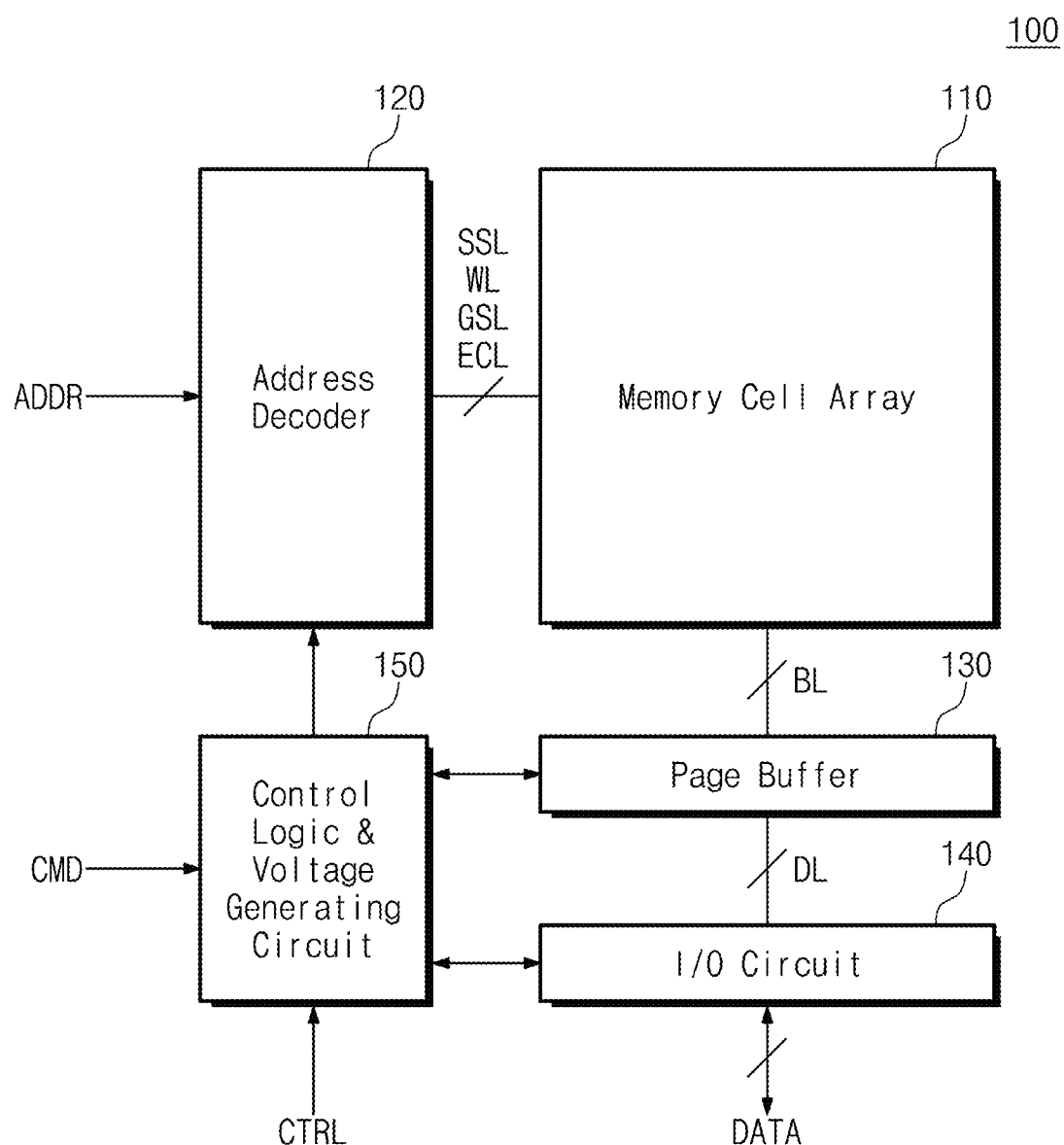
FIG. 1 is a block diagram illustrating a memory device according to an embodiment of the present disclosure.

FIG. 1 is a block diagram illustrating a memory device according to an embodiment of the present disclosure. Referring to FIG. 1, a memory device 100 may include a memory cell array 110, an address decoder 120, a page buffer circuit 130, an input/output circuit 140, and a control logic and voltage generating circuit 150. In an embodiment, the memory device 100 may be a nonvolatile memory device that includes NAND flash memory cells.

The memory cell array 110 may include a plurality of memory blocks. Each of the plurality of memory blocks may include a plurality of cell strings, each of which includes a plurality of cell transistors. The plurality of cell transistors may be connected in series between bit lines BL and a common source line CSL and may be connected with string selection lines SSL, word lines WL, and ground selection lines GSL. In an embodiment, some of the plurality of cell transistors may be connected with erase control lines ECL and may be used for an erase operation of each of the plurality of memory blocks. A structure of each of the plurality of memory blocks will be described in detail with reference to FIG. 2.

The address decoder 120 may be connected with the memory cell array 110 through the string selection lines SSL, the word lines WL, the ground selection lines GSL, and the erase control lines ECL. The address decoder 120 may receive an address ADDR from an external device (e.g., a memory controller) and may decode the received address ADDR. The address decoder 120 may control the string selection lines SSL, the word lines WL, the ground selection lines GSL, and the erase control lines ECL based on a decoding result.

The page buffer circuit 130 may be connected with the memory cell array 110 through the bit lines BL. The page buffer circuit 130 may read data stored in the memory cell array 110 by sensing voltage changes of the bit lines BL. The page buffer circuit 130 may store data in the memory cell array 110 by controlling voltages of the bit lines BL.

The input/output circuit 140 may receive data "DATA" from the external device (e.g., a memory controller) and may provide the received data "DATA" to the page buffer circuit 130. The input/output circuit 140 may receive the data "DATA" from the page buffer circuit 130 and may provide the received data "DATA" to the external device.

The control logic and voltage generating circuit 150 may receive a command CMD or a control signal CTRL from the external device (e.g., a memory controller) and may control various components of the memory device 100 in response to the received command CMD and the received control signal CTRL.

The control logic and voltage generating circuit 150 may generate various operation voltages necessary for the memory device 100 to operate. For example, the control logic and voltage generating circuit 150 may generate various operation voltages such as a plurality of program voltages, a plurality of pass voltages, a plurality of verify voltages, a plurality of read voltages, a plurality of non-selection read voltages, a plurality of erase voltages, and a plurality of erase verify voltages. Various voltages to be described below may be generated by the control logic and voltage generating circuit 150.

Figure 2:
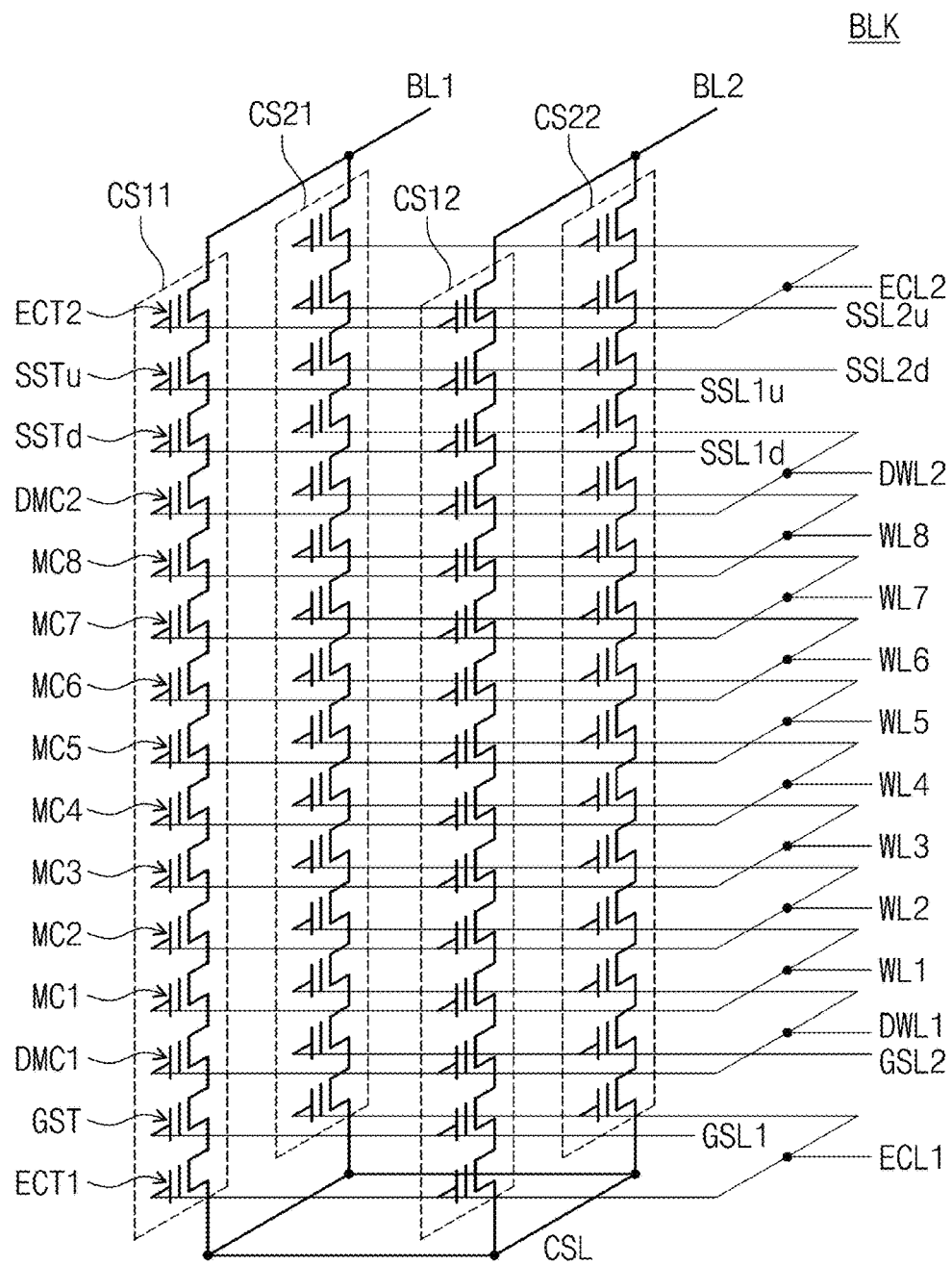
FIG. 2 is a circuit diagram illustrating one of a plurality of memory blocks included in a memory cell array in FIG. 1.

FIG. 2 is a circuit diagram illustrating one of a plurality of memory blocks included in a memory cell array in FIG. 1. A memory block of a three-dimensional structure will be described with reference to FIG. 2, but example embodiments are not limited thereto. The memory block according to the present disclosure may have a two-dimensional memory block structure. One memory block BLK will be described with reference to FIG. 2, but example embodiments are not limited thereto. The remaining memory blocks may be similar in structure to the memory block BLK to be described with reference to FIG. 2.

In an embodiment, the memory block BLK to be described with reference to FIG. 2 may correspond to a physical erase unit of the memory device 100. However, example embodiments are not limited thereto. For example, the memory device 100 may perform the erase operation in units of page, word line, sub-block, or plane.

Referring to FIG. 2, the memory block BLK includes a plurality of cell strings CS11, CS12, CS21, and CS22. The plurality of cell strings CS11, CS12, CS21, and CS22 may be arranged in a row direction and a column direction to form rows and columns.

Each of the plurality of cell strings CS11, CS12, CS21, and CS22 includes a plurality of cell transistors. For example, each of the plurality of cell strings CS11, CS12, CS21, and CS22 may include string selection transistors SSTu and SSTd, a plurality of memory cells MC1 to MC8, a ground selection transistor GST, dummy memory cells DMC1 and DMC2, and erase control transistors ECT1 and ECT2. In an embodiment, each of the plurality of cell transistors included in the cell strings CS11, CS12, CS21, and CS22 may be a charge trap flash (CTF) memory cell.

In each cell string, the plurality of memory cells MC1 to MC8 are serially connected and are stacked in a height direction that is a direction perpendicular to a plane defined by the row direction and the column direction or to a substrate. In each cell string, the string selection transistors SSTu and SSTd are serially connected, and the serially connected string selection transistors SSTu and SSTd are provided between a bit line BL1 or BL2 and the plurality of memory cells MC1 to MC8. In each cell string, the ground selection transistor GST may be provided between the plurality of memory cells MC1 to MC8 and the common source line CSL.

In an embodiment, the first dummy memory cell DMC1 may be provided between the plurality of memory cells MC1 to MC8 and the ground selection transistor GST. In an embodiment, the second dummy memory cell DMC2 may be provided between the string selection transistors SSTu and SSTd and the plurality of memory cells MC1 to MC8.

In an embodiment, the first erase control transistor ECT1 may be provided between the ground selection transistor GST and the common source line CSL. In each cell string, the second erase control transistor ECT2 may be provided between the bit line BL1 or BL2 and the string selection transistors SSTu and SSTd. The erase control transistors ECT1 and ECT2 may be used to charge channels of the cell strings CS11, CS12, CS21, and CS22 with an erase voltage or to erase the memory block BLK, based on a gate induced drain leakage (GIDL) phenomenon.

The first erase control transistors ECT1 of the cell strings CS11, CS12, CS21, and CS22 may be connected in common with a first erase control line ECL1. However, example embodiments are not limited thereto. For example, the first erase control transistors ECT1 of the cell strings CS11, CS12, CS21, and CS22 may be controlled with different erase control lines.

Ground selection transistors, which belong to the same row, from among the ground selection transistors GST placed at the same height may be connected with the same ground selection line, and ground selection transistors belonging to different rows may be connected with different ground selection lines. For example, the ground selection transistors GST of the cell strings CS11 and CS12 in the first row may be connected with a first ground selection line GSL1, and the ground selection transistors GST of the cell strings CS21 and CS22 in the second row may be connected with a second ground selection line GSL2. However, example embodiments are not limited thereto. For example, ground selection transistors at the same height may be connected with the same ground selection line. Alternatively, ground selection transistors belonging to at least two rows from among ground selection transistors at the same height may be connected with the same ground selection line, and ground selection transistors belonging to at least two other rows from among ground selection transistors at the same height may be connected with another ground selection line Alternatively, ground selection transistors at different heights may be connected with the same ground selection line.

Memory cells of the same height from the substrate or the ground selection transistor GST may be connected in common with the same word line, and memory cells at different heights may be connected with different word lines. For example, the first to eighth memory cells MC1 to MC8 of the cell strings CS11, CS12, CS21, and CS22 may be connected in common with first to eighth word lines WL1 to WL8, respectively.

String selection transistors, which belong to the same row, from among the first string selection transistors SSTd at the same height are connected with the same string selection line, and string selection transistors belonging to different rows are connected with different string selection lines. For example, the first string selection transistors SSTd of the cell strings CS11 and CS12 in the first row may be connected in common with a string selection line SSL1d, and the first string selection transistors SSTd of the cell strings CS21 and CS22 in the second row may be connected in common with a string selection line SSL2d.

Likewise, string selection transistors, which belong to the same row, from among the second string selection transistors SSTu at the same height are connected with the same string selection line, and string selection transistors in different rows are connected with different string selection lines. For example, the second string selection transistors SSTu of the cell strings CS11 and CS12 in the first row are connected in common with a string selection line SSL1u, and the second string selection transistors SSTu of the cell strings CS21 and CS22 in the second row may be connected in common with a string selection line SSL2u.

In an embodiment, dummy memory cells at the same height are connected with the same dummy word line, and dummy memory cells at different heights are connected with different dummy word lines. For example, the first dummy memory cells DMC1 are connected with a first dummy word line DWL1, and the second dummy memory cells DMC2 are connected with a second dummy word line DWL2.

The second erase control transistors ECT2 of the cell strings CS11, CS12, CS21, and CS22 may be connected in common with a second erase control line ECL2. However, example embodiments are not limited thereto. For example, the second erase control transistors ECT2 of the cell strings CS11, CS12, CS21, and CS22 may be controlled with different erase control lines.

In an embodiment, the memory block BLK illustrated in FIG. 2 is only an example. The number of cell strings may increase or decrease, and the number of rows of cell strings and the number of columns of cell strings may increase or decrease depending on the number of cell strings. Also, the number of cell transistors (e.g., GST, MC, DMC, SST, and ECT) in the memory block BLK may increase or decrease, and the height of the memory block BLK may increase or decrease depending on the number of cell transistors (e.g., GST, MC, DMC, SST, and ECT). Also, the number of lines (e.g., GSL, WL, DWL, SSL, and ECL) connected with cell transistors may increase or decrease depending on the number of cell transistors.

Figure 3:
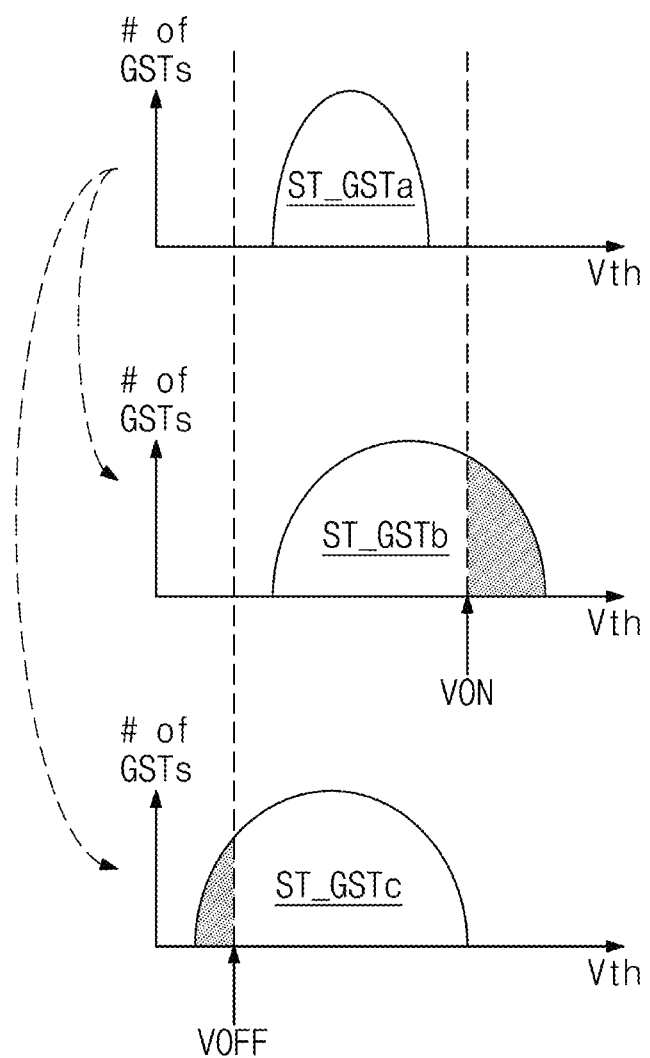
FIG. 3 is a diagram illustrating a threshold voltage distribution of ground selection transistors of a memory block of FIG. 2.

FIG. 3 is a diagram illustrating a threshold voltage distribution of ground selection transistors of a memory block of FIG. 2. Referring to FIGS. 1 to 3, the memory device 100 may control cell transistors of the memory block BLK by applying various operation voltages to various lines (e.g., ECL, SSL, WL, DWL, and GSL).

For example, the ground selection transistors GST of the memory block BLK may have a first GST state ST_GSTa as illustrated in FIG. 3. That is, the ground selection transistors GST of the memory block BLK may have threshold voltages that are higher than an off voltage VOFF and are lower than an on voltage VON. Accordingly, in the case where the off voltage VOFF is applied to the ground selection line GSL1 or GSL2, the ground selection transistors GST may be normally turned off. In the case where the on voltage VON is applied to the ground selection line GSL1 or GSL2, the ground selection transistors GST may be normally turned on. In this case, various operations (e.g., a program operation, a read operation, and an erase operation) of the memory device 100 may be normally performed.

In an embodiment, as the memory device 100 performs various operations (e.g., a program operation, a read operation, and an erase operation), the ground selection transistors GST of the memory block BLK may be degraded, thereby causing a change in threshold voltages of the ground selection transistors GST.

For example, as illustrated in FIG. 3, as the ground selection transistors GST are degraded, a threshold voltage of the ground selection transistors GST may change to a second GST state ST_GSTb, and threshold voltages of some of the ground selection transistors GST may become higher than the on voltage VON. In this case, even though the on voltage VON is applied the ground selection line GSL1 or GSL2, some of the ground selection transistors GST may not be turned on.

Alternatively, as illustrated in FIG. 3, as the ground selection transistors GST are degraded, a threshold voltage of the ground selection transistors GST may change to a third GST state ST_GSTc, and threshold voltages of some of the ground selection transistors GST may become lower than the off voltage VOFF. In this case, even though the off voltage VOFF is applied the ground selection line GSL1 or GSL2, some of the ground selection transistors GST may not be turned off.

As described above, as the ground selection transistors GST are degraded, the ground selection transistors GST may not be driven in an intended operation state (e.g., a turn-on or turn-off state). This may mean that the reliability of operation of the memory device 100 is reduced. Accordingly, it may be necessary to maintain a threshold voltage distribution of the ground selection transistors GST within a given range for the purpose of the reliability of operation of the memory device 100. To this end, the memory device 100 may perform a distribution enhancement operation on the ground selection transistors GST.

Figure 4:
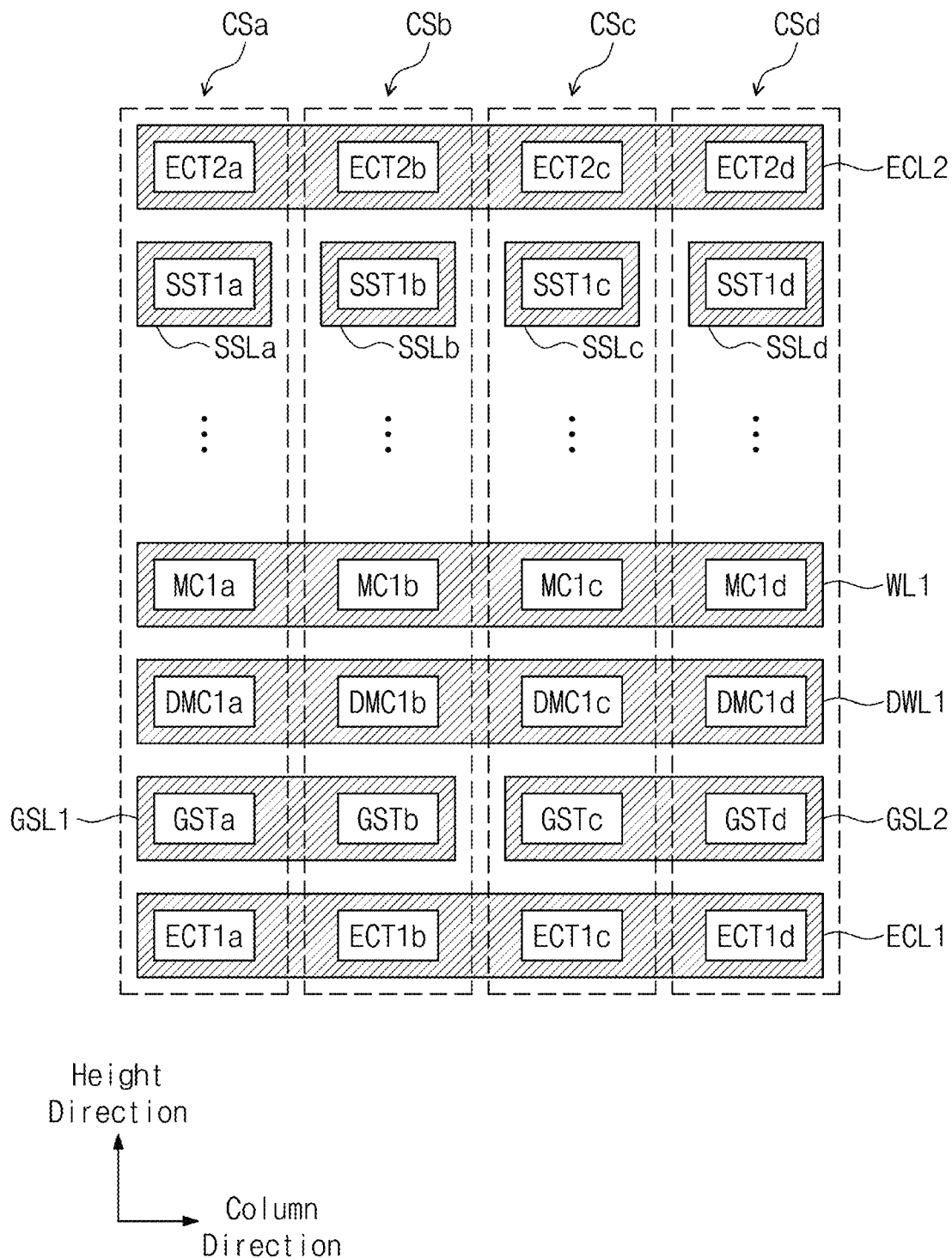
FIG. 4 is a vertical cross-sectional view of a memory block included in a memory cell array of FIG. 1.
Figure 5:
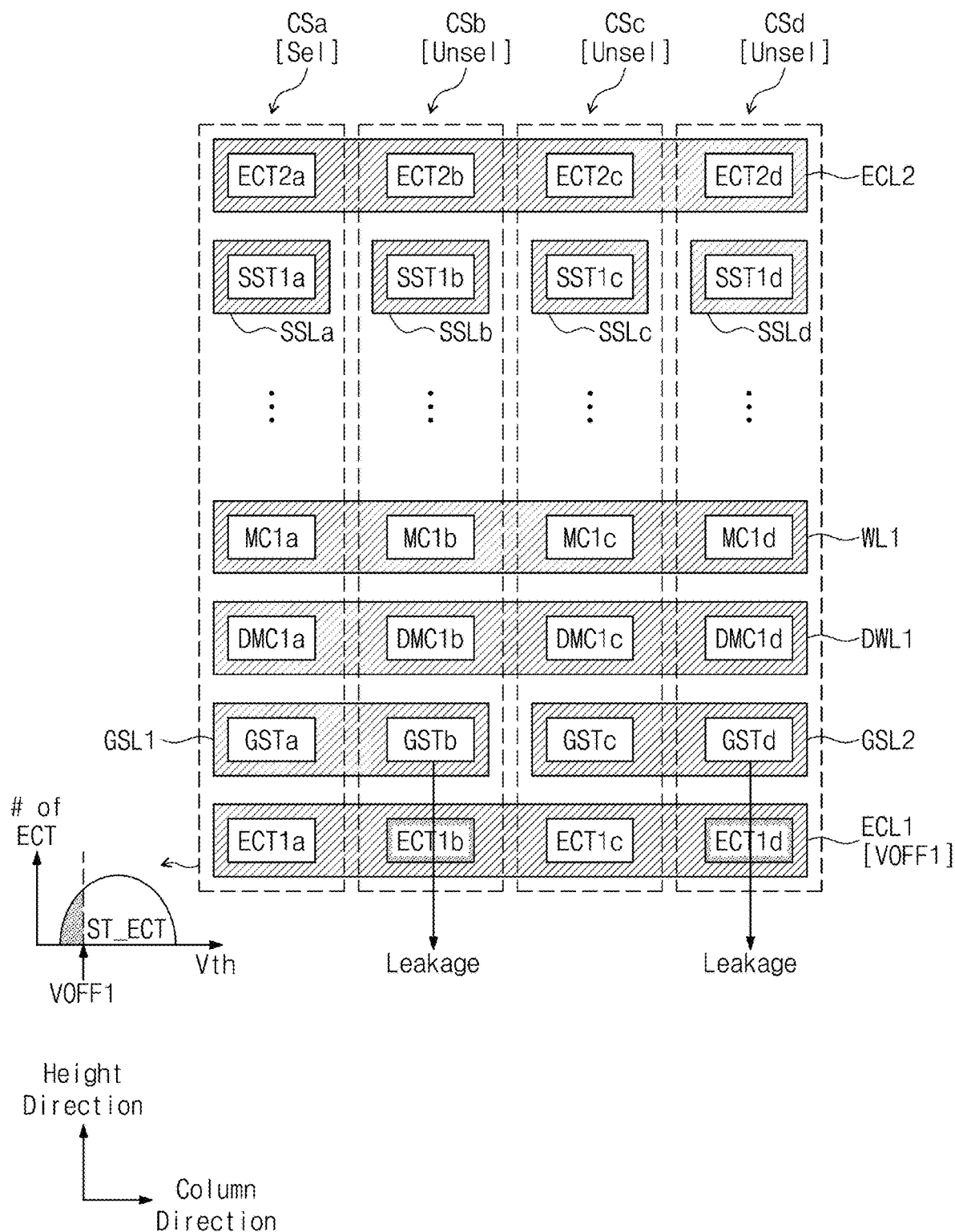
FIG. 5 is a diagram for describing a distribution enhancement operation associated with ground selection transistors of a memory block of FIG. 4.

FIG. 4 is a vertical cross-sectional view of a memory block included in a memory cell array of FIG. 1. FIG. 5 is a diagram for describing a distribution enhancement operation associated with ground selection transistors of a memory block of FIG. 4. Referring to FIGS. 1, 4, and 5, the memory block BLK may include a-th, b-th, c-th, and d-th cell strings CSa, CSb, CSc, and CSd. The a-th, b-th, c-th, and d-th cell strings CSa, CSb, CSc, and CSd may be placed at the same row and may be connected with the same bit line BL. Each of the a-th, b-th, c-th, and d-th cell strings CSa, CSb, CSc, and CSd may be similar in structure to the cell strings CS11 to CS22 of the memory block BLK of FIG. 2, and thus, additional description will be omitted to avoid redundancy.

Erase control transistors ECT1a, ECT1b, ECT1c, and ECT1d of the cell strings CSa to CSd may be connected in common with the first erase control line ECL1. The ground selection transistors GSTa and GSTb of the cell strings CSa and CSb may be connected in common with the first ground selection line GSL1, and the ground selection transistors GSTc and GSTd of the cell strings CSc and CSd may be connected in common with the second ground selection line GSL2. Dummy memory cells DMC1a, DMC1b, DMC1c, and DMC1d of the cell strings CSa to CSd may be connected in common with the first dummy word line DWL1. Memory cells MC1a, MC1b, MC1c, and MC1d of the cell strings CSa to CSd may be connected in common with the first word line WL1. String selection transistors SST1a, SST1b, SST1c, and SST1d of the cell strings CSa to CSd may be respectively connected in common with string selection lines SSLa, SSLb, SSLc, and SSLd. Erase control transistors ECT2a, ECT2b, ECT2c, and ECT2d of the cell strings CSa to CSd may be connected in common with the second erase control line ECL2.

As described above, the memory device 100 may perform the distribution enhancement operation on the ground selection transistors GSTa to GSTd for the purpose of enhancing the reliability of operation of the memory device 100. For example, as illustrated in FIG. 5, to enhance a threshold voltage distribution of the ground selection transistor GSTa of the a-th cell string CSa, the program operation may be performed on the ground selection transistor GSTa of the a-th cell string CSa. To perform the program operation on the ground selection transistor GSTa of the a-th cell string CSa, the erase transistors ECT1a, ECT1b, ECT1c, and ECT1d of the cell strings CSa to CSd may be turned off. To this end, a first off voltage VOFF1 may be provided to the first erase control line ECL1.

In an embodiment, the erase control transistors ECT1a, ECT1b, ECT1c, and ECT1d of the cell strings CSa to CSd may be degraded to be similar to the ground selection transistors GSTa, GSTb, GSTc, and GSTd. That is, the erase control transistors ECT1a, ECT1b, ECT1c, and ECT1d may have an ECT state ST_ECT as illustrated in FIG. 5, and some (e.g., ECT1b and ECT1d) of the erase control transistors ECT1a, ECT1b, ECT1c, and ECT1d may not be turned off by the first off voltage VOFF1.

In this case, some ground selection transistors may be programmed to be unintended. For example, in the case where the a-th cell string CSa is a selected cell string and the ground selection transistor GSTa of the a-th cell string CSa is programmed, the remaining cell strings CSb, CSc, and CSd may be unselected strings, and the ground selection transistors GSTb, GSTc, and GSTd of the remaining cell strings CSb, CSc, and CSd may have to be program-inhibited. However, as the erase control transistors ECT1a to ECT1d are degraded, some erase control transistors (e.g., ECT1b and ECT1d) may not be normally turned off by the first off voltage VOFF1. In this case, a current may be leaked out through some erase control transistors (e.g., ECT1b and ECT1d), and boosting levels of channels corresponding to some erase control transistors (e.g., ECT1b and ECT1d) may decrease. This may mean that ground selection transistors (e.g., GSTb and GSTd) belonging to the above channels are programmed to be unintended.

As a ground selection transistor(s) is programmed to be unintended (e.g., as a ground selection transistor to be program-inhibited is programmed), a threshold voltage distribution of ground selection transistors may exceed a given range. In this case, the reliability of operation of the memory device 100 may be reduced as described above.

Figure 6:
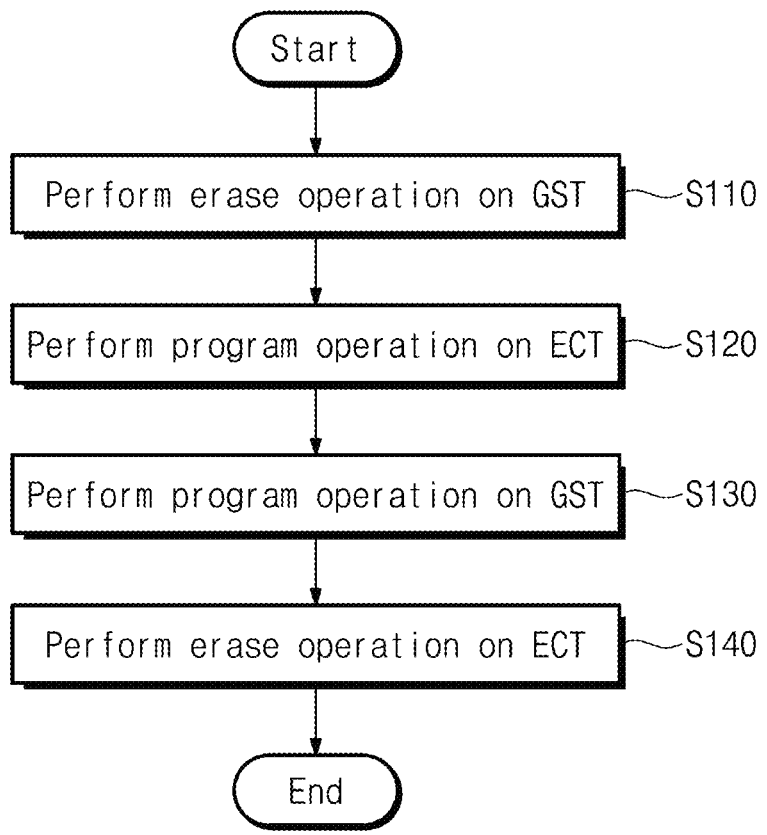
FIG. 6 is a flowchart illustrating an operation of a memory device of FIG. 1.

FIG. 6 is a flowchart illustrating an operation of a memory device of FIG. 1. Referring to FIGS. 1, 2, 4, and 6, the memory device 100 may perform the distribution enhancement operation on a ground selection transistor GST by performing operation S110 to operation S140.

In operation S110, the memory device 100 may perform the erase operation on the ground selection transistors GST. For example, the memory device 100 may perform the erase operation on the ground selection transistors GST of the memory block BLK such that the ground selection transistors GST of the memory block BLK have threshold voltages lower than a first verify voltage VVFY1.

In operation S120, the memory device 100 may perform the program operation on the erase control transistors ECT. For example, the memory device 100 may perform the program operation on the erase control transistors ECT of the memory block BLK such that the erase control transistors ECT of the memory block BLK have threshold voltages higher than a second verify voltage VVFY2.

In operation S130, the memory device 100 may perform the program operation on the ground selection transistors GST. For example, the memory device 100 may perform the program operation on the ground selection transistors GST of the memory block BLK such that the ground selection transistors GST of the memory block BLK have threshold voltages higher than a third verify voltage VVFY3.

In operation S140, the memory device 100 may perform the erase operation on the erase control transistors ECT. For example, the memory device 100 may perform the erase operation on the erase control transistors ECT of the memory block BLK such that the erase control transistors ECT of the memory block BLK have threshold voltages lower than a fourth verify voltage VVFY4.

According to the flowchart of FIG. 6, before performing the program operation on the ground selection transistor GST, the memory device 100 may first perform the program operation on the erase control transistor ECT. In this case, the erase control transistors ECT of the memory block BLK may have threshold voltages higher than the second verify voltage VVFY2 by programming the erase control transistors ECT. In an embodiment, a level of the second verify voltage VVFY2 may be higher than or equal to a level of the first off voltage VOFF1 provided to an erase control line in the program operation for the ground selection transistor(s) GST.

That is, as the erase control transistors ECT are first programmed before the ground selection transistors GST are programmed, the erase control transistors ECT may have threshold voltages higher than or equal to the first off voltage VOFF1, and thus, the erase control transistors ECT may be normally turned off while the ground selection transistors GST are programmed. Accordingly, the ground selection transistors GST may be limited and/or prevented from experiencing unintended programming. In other words, the threshold voltage distribution of the ground selection transistors GST may be included within a given range.

FIG. 7 is a diagram illustrating a bias condition associated with each operation described with reference to the flowchart of FIG. 6. Referring to FIGS. 1, 2, 4, 6, and 7, based on the bias conditions illustrated in FIG. 7, the memory device 100 may perform the erase operation on the ground selection transistors GST of the memory block BLK, may perform the program operation on the erase control transistors ECT of the memory block BLK, may perform the program operation on the ground selection transistors GST, and may perform the erase operation on the erase control transistors ECT.

For example, to perform the erase operation on the ground selection transistors GST, the memory device 100 may repeatedly perform a GST erase loop including a GST erase operation GST ERS and a GST erase verify operation GST ERS VFY. In the GST erase operation GST ERS, the memory device 100 may apply an erase voltage VERS to the common source line CSL, may apply a word line erase voltage VERS_WL to the first erase control line ECL1, may apply the word line erase voltage VERS_WL to the first ground selection line GSL1, and may float the first dummy word line DWL1, the plurality of word lines WLs, the second dummy word line DWL2, the string selection lines SSL1d and SSL1u, and the second erase control line ECL2. In an embodiment, the string selection lines SSL1d and SSL1u may be floated at a point in time when a voltage of the common source line CSL reaches a first voltage V1, and the second erase control line ECL2 may be floated at a point in time when the voltage of the common source line CSL reaches a second voltage V2. According to the above bias condition for the GST erase operation GST ERS, threshold voltages of the ground selection transistors GST may decrease.

Afterwards, in the GST erase verify operation GST ERS VFY, the memory device 100 may apply the first verify voltage VVFY1 to the first erase control line ECL1 and the first ground selection line GSL1, and may apply a first on voltage VON1 to the first dummy word line DWL1, the plurality of word lines WLs, the second dummy word line DWL2, the string selection lines SSL1d and SSL1u, and the second erase control line ECL2. In an embodiment, the first on voltage VON1 may be a voltage that is high enough to turn on cell transistors connected with the first dummy word line DWL1, the plurality of word lines WLs, the second dummy word line DWL2, the string selection lines SSL1d and SSL1u, and the second erase control line ECL2.

In an embodiment, in the GST erase verify operation GST ERS VFY, when the ground selection transistors GST are not erased normally, the memory device 100 may again perform the GST erase loop including the GST erase operation GST ERS and the GST erase verify operation GST ERS VFY. In an embodiment, in the case where the GST erase loop is again performed, the erase voltage VERS applied to the common source line CSL in the previous GST erase loop may increase.

To perform the program operation on the erase control transistors ECT, the memory device 100 may repeatedly perform an ECT program loop including an ECT program operation ECT PGM and an ECT program verify operation ECT PGM VFY. In the ECT program operation ECT PGM, the memory device 100 may apply a first program voltage VPGM1 to the first erase control line ECL1, may apply a first pass voltage VPASS1 to the first ground selection line GSL1, the first dummy word line DWL1, the plurality of word lines WLs, and the second dummy word line DWL2, and may apply a second pass voltage VPASS2 to the string selection lines SSL1d and SSL1u and the second erase control line ECL2. In an embodiment, the first pass voltage VPASS1 may be higher than the second pass voltage VPASS2. Threshold voltages of the erase control transistors ECT connected with the first erase control line ECL1 may increase through the ECT program operation ECT PGM.

In the ECT program verify operation ECT PGM VFY, the memory device 100 may apply the second verify voltage VVFY2 to the first erase control line ECL1, may apply a second on voltage VON2 to the first ground selection line GSL1, the first dummy word line DWL1, the plurality of word lines WLs, and the second dummy word line DWL2, and may apply a third on voltage VON3 to the string selection lines SSL1d and SSL1u and the second erase control line ECL2. Whether the threshold voltages of the erase control transistors ECT connected with the first erase control line ECL1 are higher than the second verify voltage VVFY2 may be determined through the ECT program verify operation ECT PGM VFY.

When the threshold voltages of the erase control transistors ECT connected with the first erase control line ECL1 are not higher than the second verify voltage VVFY2 (e.g., in the case where a determination result does not indicate a program pass), the memory device 100 may perform a next ECT program loop. In this case, the memory device 100 may provide the first erase control line ECL1 with a program voltage higher than the first program voltage VPGM1 used in the previous program loop.

To perform the program operation on the ground selection transistors GST, the memory device 100 may perform a GST program loop including a GST program operation GST PGM and a GST program verify operation GST PGM VFY. In the GST program operation GST PGM, the memory device 100 may apply the first off voltage VOFF1 to the first erase control line ECL1, may apply a second program voltage VPGM2 to the first ground selection line GSL1, may apply the first pass voltage VPASS1 to the first dummy word line DWL1, the plurality of word lines WLs, and the second dummy word line DWL2, and may apply the second pass voltage VPASS2 to the string selection lines SSL1*d* and SSL1*u* and the second erase control line ECL2. Threshold voltages of the ground selection transistors GST connected with the first ground selection line GSL1 may increase through the GST program operation GST PGM.

In the GST program verify operation GST PGM VFY, the memory device 100 may apply the second on voltage VON2 to the first erase control line ECL1, may apply the third verify voltage VVFY3 to the first ground selection line GSL1, may apply the second on voltage VON2 to the first dummy word line DWL1, the plurality of word lines WLs, and the second dummy word line DWL2, and may apply the third on voltage VON3 to the string selection lines SSL1*d* and SSL1*u*. Whether the threshold voltages of the ground selection transistors GST connected with the first ground selection line GSL1 is higher than the third verify voltage VVFY3 through the GST program verify operation GST PGM VFY may be determined.

In an embodiment, the threshold voltages of the erase control transistors ECT connected with the first erase control line ECL1 may be higher than the second verify voltage VVFY2 by programming the erase control transistors ECT. The second verify voltage VVFY2 may be higher than or equal to the first off voltage VOFF1. In this case, in the GST program operation GST PGM, as the first off voltage VOFF1 is applied to the first erase control line ECL1, erase control transistors connected with the first erase control line ECL1 may be normally turned off. Accordingly, the unintended programming of unselected erase control transistors or program-inhibited erase control transistors may be limited and/or prevented.

To perform the erase operation on the erase control transistors ECT, the memory device 100 may perform ECT erase loops each including an ECT erase operation ECT ERS and an ECT erase verify operation ECT ERS VFY. In the ECT erase operation ECT ERS, the memory device 100 may apply the erase voltage to the common source line CSL, may apply the word line erase voltage VERS_WL to the first erase control line ECL1, and may float the first ground selection line GSL1, the first dummy word line DWL1, the plurality of word lines WLs, the second dummy word line DWL2, the string selection lines SSL1*d* and SSL1*u*, and the second erase control line ECL2. In an embodiment, the string selection lines SSL1*d* and SSL1*u* may be floated at a point in time when a voltage of the common source line CSL reaches the first voltage V1, and the second erase control line ECL2 may be floated at a point in time when the voltage of the common source line CSL reaches the second voltage V2. Threshold voltages of the erase control transistors ECT connected with the first erase control line ECL1 may decrease through the erase operation of the ECT erase operation. In an embodiment, the word line erase voltage VERS_WL may be lower in level than a voltage of the remaining word lines floated.

In the ECT erase verify operation ECT ERS VFY, the memory device 100 may apply the fourth verify voltage VVFY4 to the first erase control line ECL1, and may apply the first on voltage VON1 to the first ground selection line GSL1, the first dummy word line DWL1, the plurality of word lines WLs, the second dummy word line DWL2, the string selection lines SSL1*d* and SSL1*u*, and the second erase control line ECL2. Whether the threshold voltages of the erase control transistors ECT connected with the first erase control line ECL1 are lower than the fourth verify voltage VVFY4 may be determined through the ECT erase verify operation ECT ERS VFY.

In an embodiment, with regard to the program operations and the erase operations described above, the memory device 100 may perform one program operation or one erase operation without repeating a plurality of loops in each operation (e.g., each verify operation may be omitted).

In an embodiment, in the erase operation associated with the ground selection transistors GST, the memory device 100 may apply the word line erase voltage VERS_WL or a voltage, which is lower than that of any other word lines, to the first dummy word line DWL1, instead of floating the first dummy word line DWL1. In this case, dummy memory cells connected with the first dummy word line DWL1 may be erased together.

Figure 8:
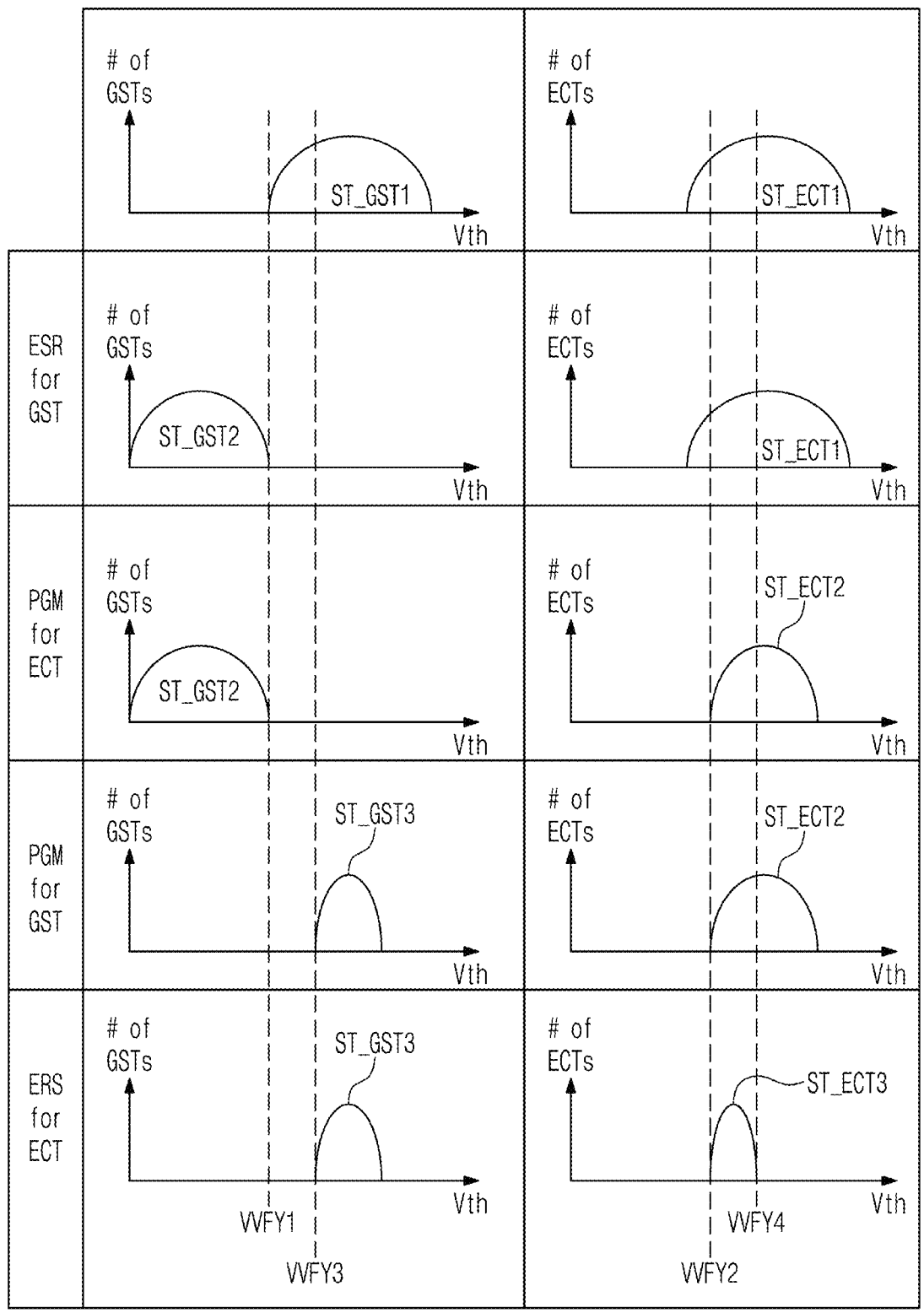
FIG. 8 is a diagram illustrating threshold voltage distributions of ground selection transistors and erase control transistors according to an operation of the flowchart of FIG. 6.

FIG. 8 is a diagram illustrating threshold voltage distributions of ground selection transistors and erase control transistors according to an operation of the flowchart of FIG. 6. Referring to FIGS. 1, 2, 3, 6, and 8, before the memory device 100 performs the distribution enhancement operation on the ground selection transistors GST, the ground selection transistors GST may have a first GST state ST_GST10, and the erase control transistors ECT may have a first ECT state ST_ECT1.

First, the memory device 100 may perform the erase operation on the ground selection transistors GST for the purpose of decreasing threshold voltages of the ground selection transistors GST. In the case where the erase operation is performed on the ground selection transistors GST, the ground selection transistors GST may have a second GST state ST_GST2. An upper limit of the second GST state ST_GST2 may be lower than or equal to the first verify voltage VVFY1.

Afterwards, the memory device 100 may perform the program operation on the erase control transistors ECT for the purpose of increasing threshold voltages of the erase control transistors ECT. In the case where the program operation is performed on the erase control transistors ECT, the erase control transistors ECT may have a second ECT state ST_ECT2. A lower limit of the second ECT state ST_ECT2 may be higher than or equal to the second verify voltage VVFY2.

Afterwards, the memory device 100 may perform the program operation on the ground selection transistors GST for the purpose of increasing threshold voltages of the ground selection transistors GST. In the case where the program operation is performed on the ground selection transistors GST, the ground selection transistors GST may have a third GST state ST_GST3. A lower limit of the third GST state ST_GST3 may be higher than or equal to the third verify voltage VVFY3.

Afterwards, the memory device 100 may perform the erase operation on the erase control transistors ECT for the purpose of decreasing threshold voltages of the erase control transistors ECT. In the case where the erase operation is performed on the erase control transistors ECT, the erase control transistors ECT may have a third ECT state ST_ECT3. An upper limit of the third ECT state ST_ECT3 may be lower than or equal to the fourth verify voltage VVFY4.

As described above, the erase control transistors ECT may be programmed before the program operation is performed on the ground selection transistors GST; in this case, the erase control transistors ECT may be turned off normally when the program operation is performed on the ground selection transistors GST. In other words, a leakage current in unselected cell strings or program-inhibited cell strings may be limited and/or prevented, and a threshold voltage distribution of the ground selection transistors GST may be included in a given range.

Figure 9:
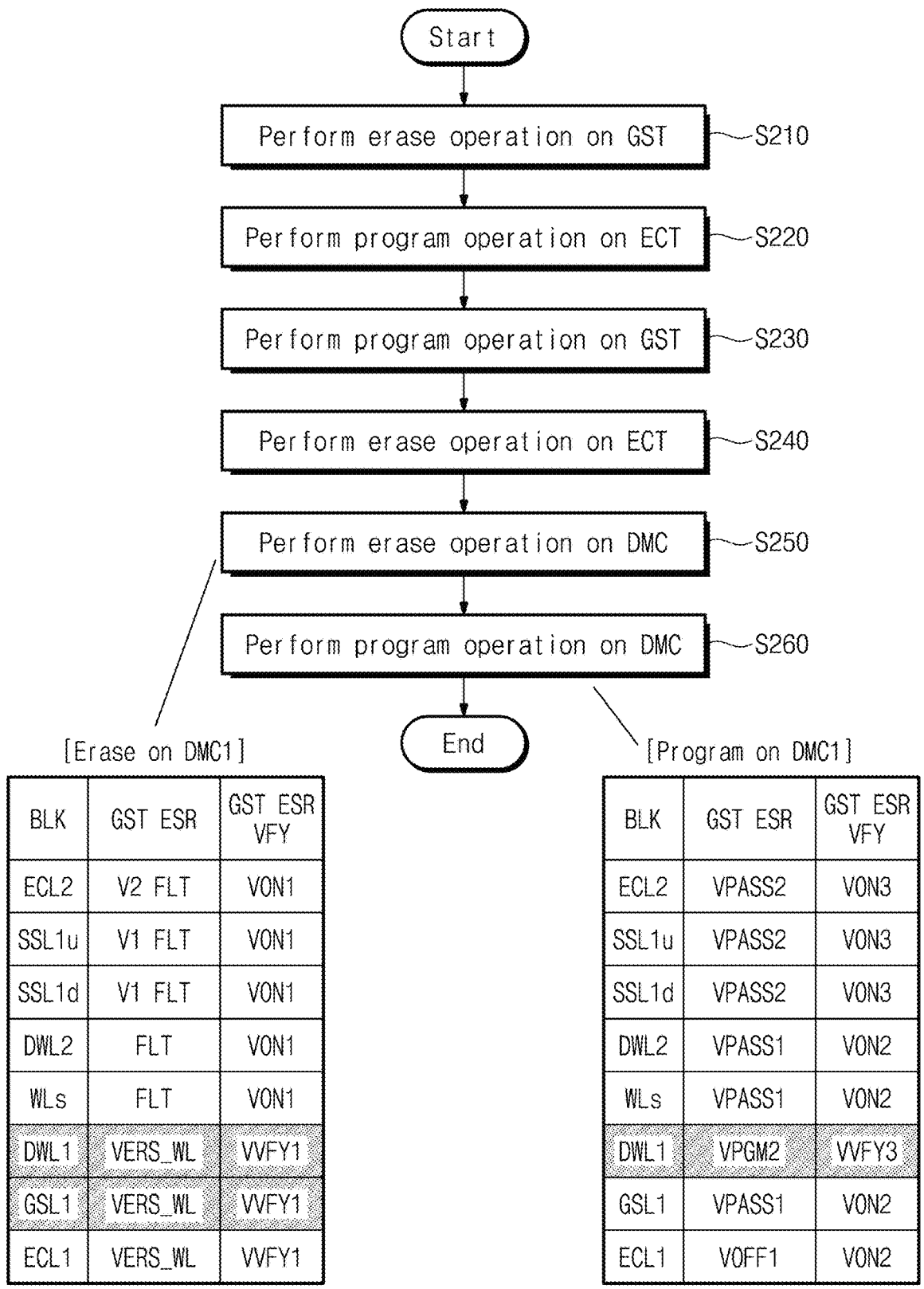
FIG. 9 is a flowchart illustrating an operation of a memory device of FIG. 1.

FIG. 9 is a flowchart illustrating an operation of a memory device of FIG. 1. In an embodiment, to enhance the reliability of operation of the memory device 100, the memory device 100 may perform the distribution enhancement operation on any other cell transistors (e.g., DMC or SST) in addition to the ground selection transistors GST. For example, in the embodiments described with reference to FIGS. 1 to 8, the memory device 100 may perform the distribution enhancement operation on the ground selection transistors GST. In an embodiment illustrated in FIG. 9, the memory device 100 may perform the distribution enhancement operation on dummy memory cells.

For example, as illustrated in FIG. 9, in operation S210, the memory device 100 may perform the erase operation on the ground selection transistors GST. In operation S220, the memory device 100 may perform the program operation on the erase control transistors ECT. In operation S230, the memory device 100 may perform the program operation on the ground selection transistors GST. In operation S240, the memory device 100 may perform the erase operation on the erase control transistors ECT. Operation S210 to operation S240 are similar to operation S110 to operation S140 of FIG. 6, and thus, additional description will be omitted to avoid redundancy.

In operation S250, the memory device 100 may perform the erase operation on the dummy memory cells DMC. In operation S260, the memory device 100 may perform the program operation on the dummy memory cells DMC. For example, in an embodiment, the distribution enhancement operation may be performed on the first dummy memory cells DMC1 adjacent to the ground selection transistors GST. The distribution enhancement operation for the first dummy memory cells DMC1 may be performed through the erase operation and the program operation for the first dummy memory cells DMC1.

As shown in FIG. 9, in operation S250, the erase operation for the first dummy memory cells DMC1 may be performed to be similar to the erase operation for the ground selection transistors GST. In this case, except that the word line erase voltage VERS_WL is applied to the first dummy word line DWL1 instead of floating the first dummy word line DWL1, the same bias condition may be applied to the remaining lines other than the first dummy word line DWL1, and thus, additional description will be omitted to avoid redundancy.

As shown in FIG. 9, in operation S260, the program operation for the first dummy memory cells DMC1 may be performed to be similar to the program operation for the ground selection transistors GST. In this case, except that the second program voltage VPGM2 and the third verify voltage VVFY3 are provided to the first dummy word line DWL1 and the first pass voltage VPASS1 and the second on voltage VON2 are provided to the first ground selection line GSL1, the same bias condition may be applied to the remaining lines other than the first dummy word line DWL1 and the first ground selection line GSL1, and thus, additional description will be omitted to avoid redundancy.

As described above, according to embodiments of the present disclosure, the memory device 100 may perform the distribution enhancement operation on ground selection transistors, and thus, the reliability of operation may be enhanced. In an embodiment, the memory device 100 may perform the distribution enhancement operation on any other cell transistors (e.g., any other cell transistors other than cell transistors connected with a plurality of word lines) in addition to the ground selection transistors GST.

For example, in an embodiment, the distribution enhancement operation may be performed on the second dummy memory cells DMC2. In this case, the memory device 100 may perform the erase operation on the second dummy memory cells DMC2, may perform the program operation on the first erase control transistor ECT1, may perform the program operation on the second dummy memory cells DMC2, and may perform the erase operation on the first erase control transistor ECT1. That is, the memory device 100 may first perform the program operation on erase control transistors before performing the program operation on cell transistors targeted for the distribution enhancement operation. As such, in the distribution enhancement operation, as the erase control transistors ECT are normally turned off, a threshold voltage distribution of cell transistors targeted for the distribution enhancement operation may be enhanced.

Figure 10:
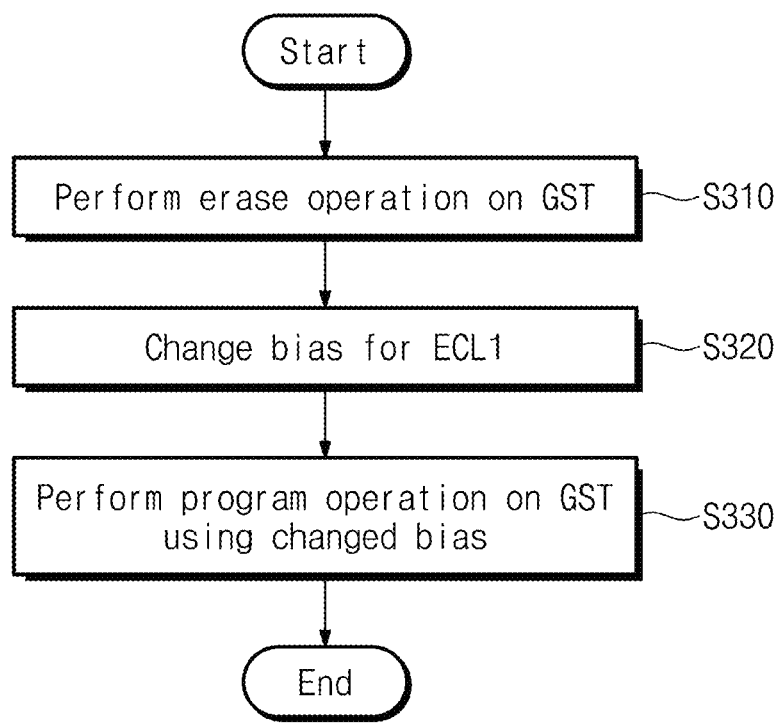
FIG. 10 is a flowchart illustrating an operation of a memory device of FIG. 1.
Figure 11:
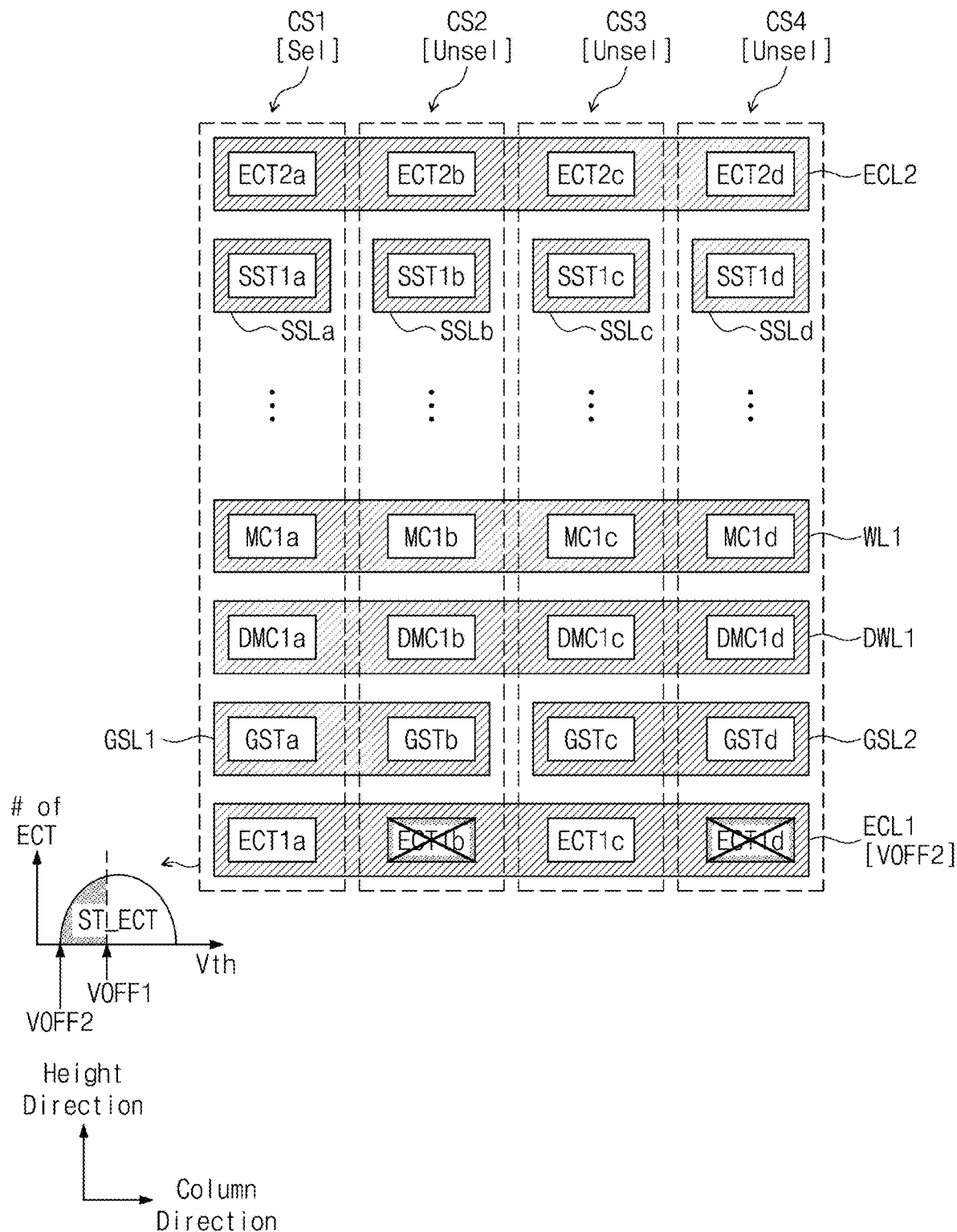
FIG. 11 is a diagram for describing an operation according to the flowchart of FIG. 10.

FIG. 10 is a flowchart illustrating an operation of a memory device of FIG. 1. FIG. 11 is a diagram for describing an operation according to the flowchart of FIG. 10. Referring to FIGS. 1, 10, and 11, the memory device 100 may perform the distribution enhancement operation on the ground selection transistors GST through operation S310 to operation S330.

In operation S310, the memory device 100 may perform the erase operation on the ground selection transistors GST. Operation S310 is described through the bias condition of operation S110 of FIG. 6 and the erase operation for the ground selection transistors GST of FIG. 7, and thus, additional description will be omitted to avoid redundancy.

In operation S320, the memory device 100 may change a bias condition for the first erase control line ECL1. In operation S330, the memory device 100 may perform the program operation on the ground selection transistors GST by using the changed bias condition.

For example, as illustrated in FIG. 11, the erase control transistors ECT1a, ECT1b, ECT1c, and ECT1d may have an ECT state ST_ECT. When the first off voltage VOFF1 is applied to the first erase control line ECL1, some erase control transistors (e.g., ECT1b and ECT1d) may not be normally turned off.

In contrast, in the case where the bias condition (e.g., an off voltage) for the first erase control line ECL1 changes from the first off voltage VOFF1 to a second off voltage VOFF2 or decreases, the erase control transistors ECT1a, ECT1b, ECT1c, and ECT1d may be normally turned off by the second off voltage VOFF2. Accordingly, in the case where the ground selection transistors GST are programmed by using the changed bias condition, because the erase control transistors ECT1a, ECT1b, ECT1c, and ECT1d are normally turned off, a leakage in unselected cell strings may be limited and/or prevented, and a threshold voltage distribution of the ground selection transistors GST may be enhanced.

Figure 12A:
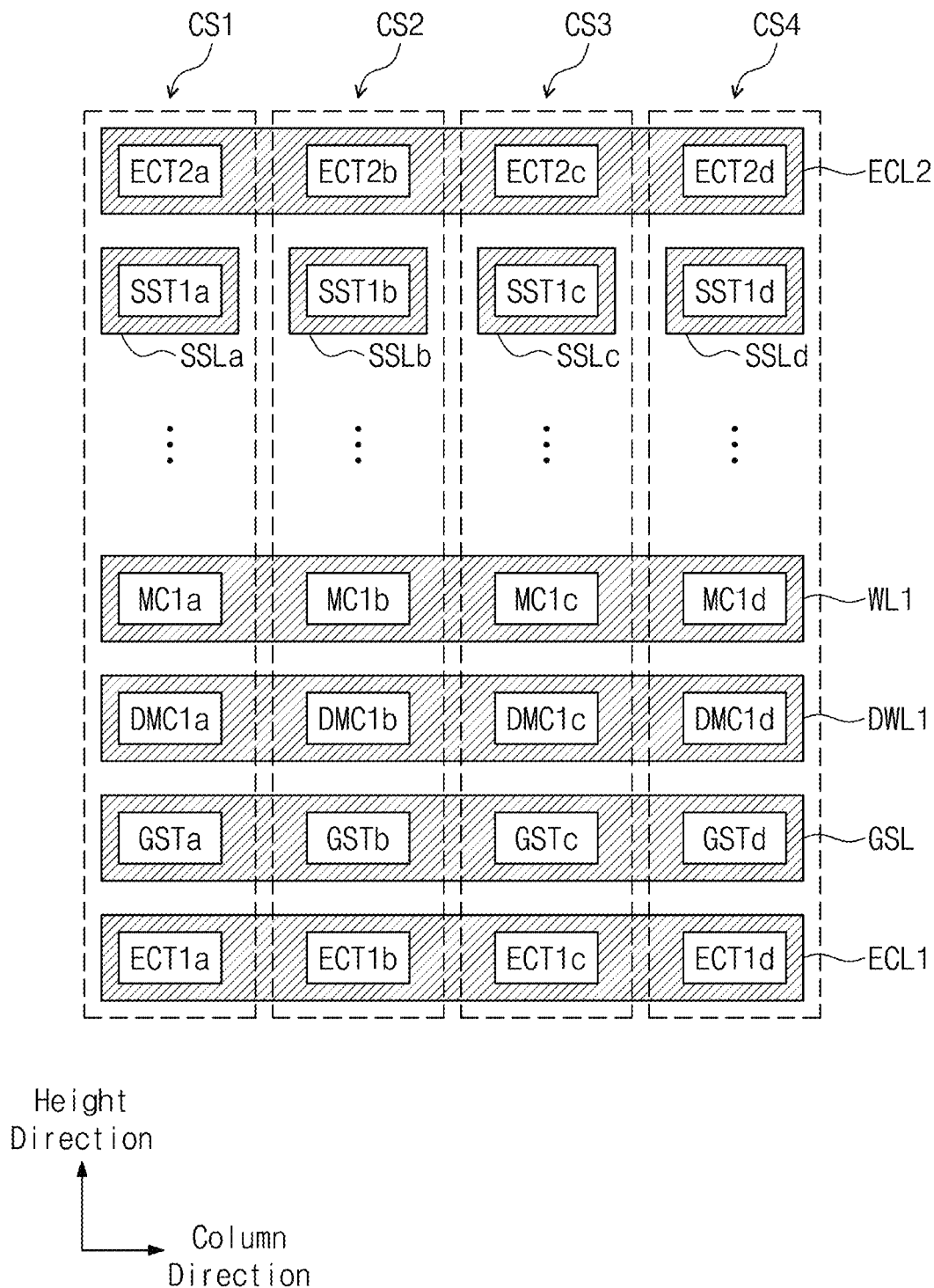
FIGS. 12A and 12B are diagrams conceptually illustrating a vertical cross section of a memory block included in a memory cell array of FIG. 1.
Figure 12B:
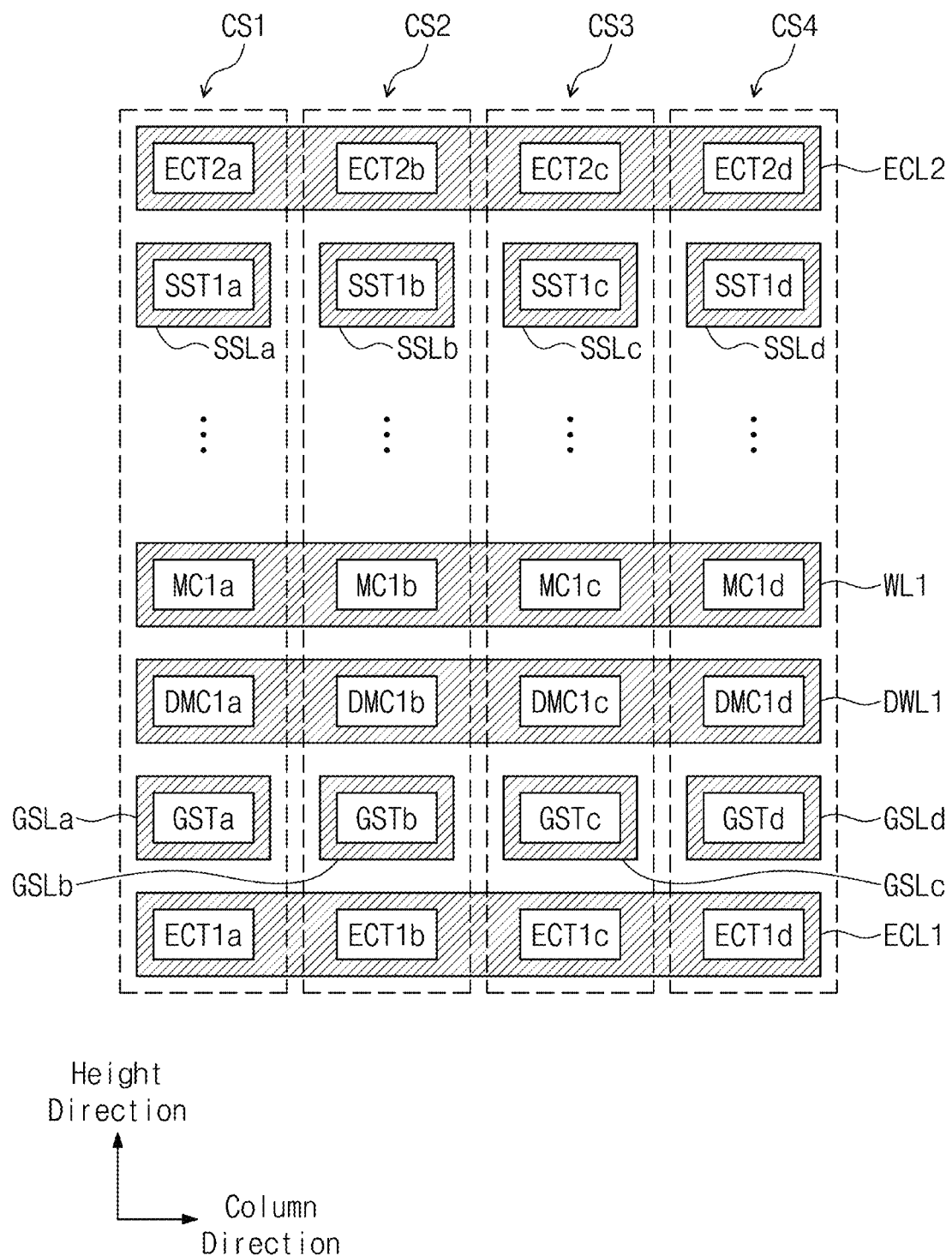

FIGS. 12A and 12B are diagrams conceptually illustrating a vertical cross section of a memory block included in a memory cell array of FIG. 1. In an embodiment, the memory blocks of FIGS. 12A and 12B are similar to the memory block described with reference to FIG. 4, and a difference between the memory blocks of FIGS. 12A and 12B and the memory block of FIG. 4 will be mainly described. In the memory block of FIG. 12A, the ground selection transistors GSTa to GSTd of the plurality of cell strings CSa to CSd are connected in common with one ground selection line GSL. In the memory block of FIG. 12B, the ground selection transistors GSTa to GSTd of the plurality of cell strings CSa to CSd are respectively connected with different ground selection lines GSLa, GSLb, GSLc, and GSLd. As described above, the ground selection transistors GSTa to GSTd and ground selection lines may be connected in various structures. Even though the ground selection transistors GSTa to GSTd and the ground selection lines are connected in various structures, the memory device 100 may program ground selection transistors GSTa to GSTd by using the operation method and the bias condition described with reference to FIGS. 6 and 7.

Figure 13:
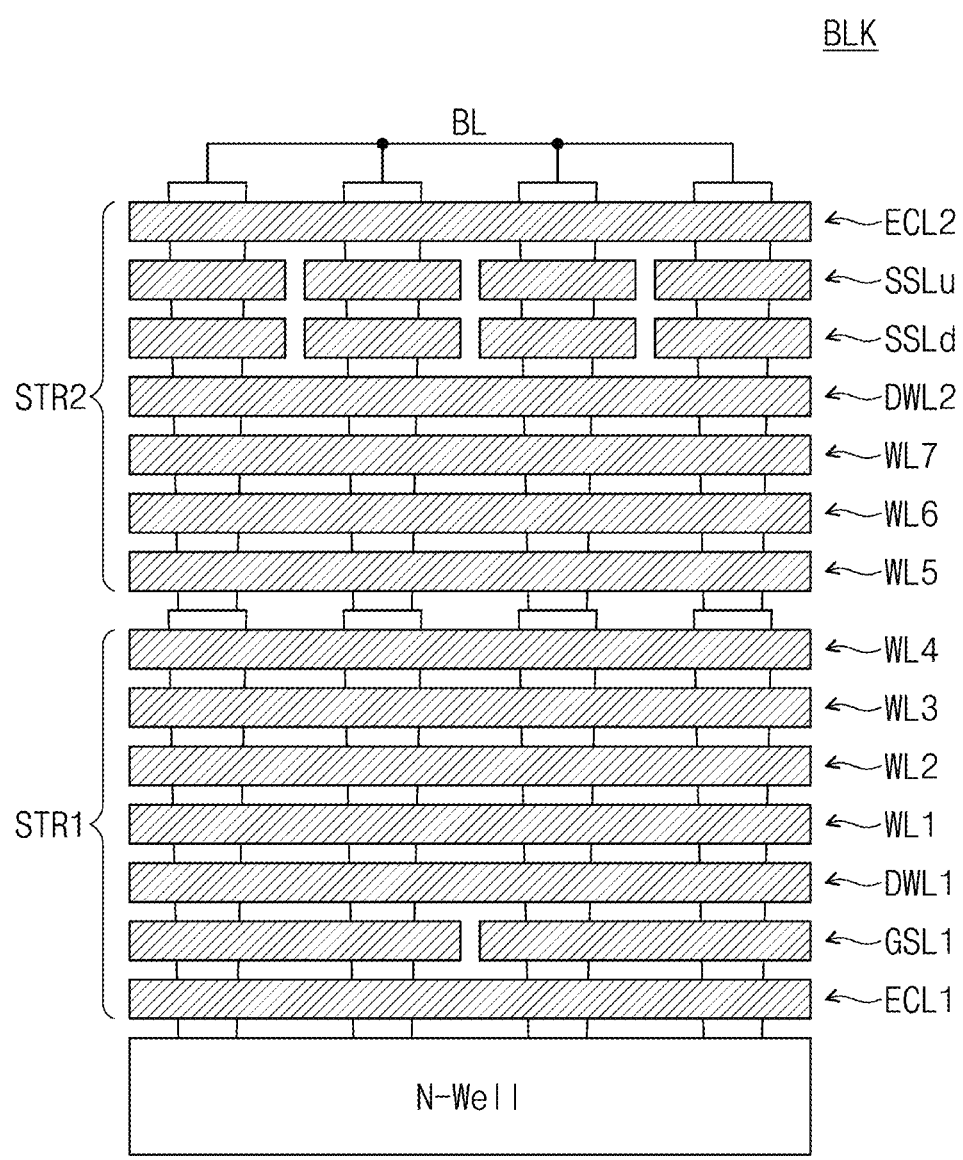
FIG. 13 is a vertical cross-sectional view of a memory block included in a memory cell array of FIG. 1.

FIG. 13 is a vertical cross-sectional view of a memory block included in a memory cell array of FIG. 1. Referring to FIG. 13, the memory block BLK may include a first structure STR1 and a second structure STR2. The first structure STR1 may include some of cell transistors of the plurality of cell strings CSa to CSd, and the second structure STR2 may include the remaining cell transistors.

The first structure STR1 may be formed on a substrate, and the second structure STR2 may be formed over the first structure STR1. For example, as illustrated in FIG. 13, the first structure STR1 may be formed on an N-well substrate. In an embodiment, a peripheral circuit (e.g., the address decoder 120, the page buffer circuit 130, the input/output circuit 140, and the control logic and voltage generating circuit 150 of FIG. 1) may be formed under the N-well substrate. That is, the memory device 100 may have a CoP (Cell-on-Peripheral) structure or a CUA (CMOS under Array) structure. In this case, the substrate that is connected with (or is in contact with) strings may be N-type. However, example embodiments are not limited thereto. For example, the substrate that is connected with strings may be P-type.

The second structure STR2 may be formed over the first structure STR1. In this case, as illustrated in FIG. 13, a channel diameter may change in a region where the first structure STR1 and the second structure STR2 are electrically connected. For example, a channel of the first structure STR1 may be formed to penetrate lines ECL1, GSL1, DWL1, and WL1 to WL4 vertically stacked on the substrate, and a channel of the second structure STR2 may be formed to penetrate lines WL5 to WL7, DWL2, SSLd, SSLu, and ECL2 stacked on the first structure STR1. The channel of the first structure STR1 and the channel of the second structure STR2 may be electrically connected in a connecting region. That is, as illustrated in FIG. 13, in the region where the first structure STR1 and the second structure STR2 are electrically connected, the channel diameter of the second structure STR2 may be smaller than the channel diameter of the first structure STR1.

As the channel diameter changes, for the reliability of operation, cell transistors adjacent to the connecting region of the first and second structures STR1 and STR2 may not be used to store actual user data. That is, word lines (e.g., WL4 and WL5) adjacent to the connecting region of the first and second structures STR1 and STR2 may be used as dummy word lines.

In an embodiment, according to embodiments of the present disclosure, the memory device 100 may perform the distribution enhancement operation on cell transistors connected with word lines (e.g., WL4 and WL5) adjacent to the region in which the first and second structures STR1 and STR2 are connected.

Figure 14:
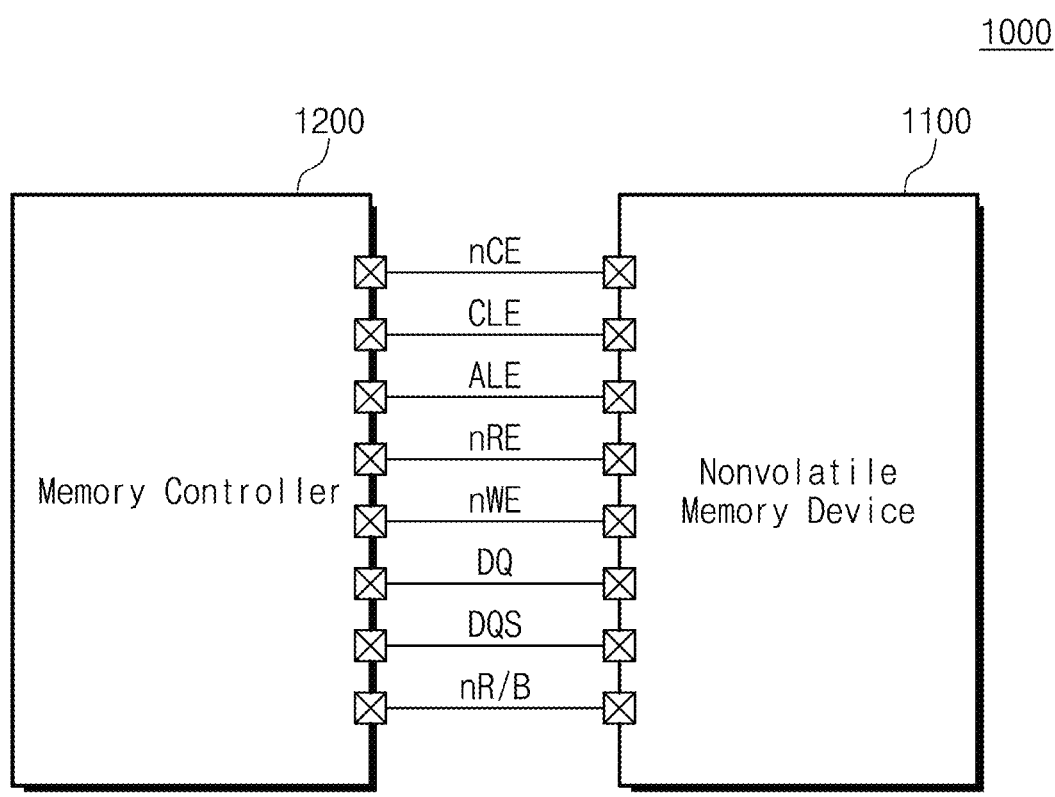
FIG. 14 is a block diagram illustrating a memory system according to an embodiment of the present disclosure.

FIG. 14 is a block diagram illustrating a memory system according to an embodiment of the present disclosure. Referring to FIG. 14, a memory system 1000 may include a memory device 1100 and a memory controller 1200. The memory system 1000 may be a storage device, which is configured to store user data in a computing system, such as a solid state drive (SSD). In an embodiment, the memory device 1100 may be the memory device described with reference to FIGS. 1 to 13 and/or may operate based on the operation method described with reference to FIGS. 1 to 13.

The memory controller 1200 may store data in the memory device 1100 or may read data stored in the memory device 1100. For example, the memory controller 1200 may send various signals (e.g., nCE, CLE, ALE, nRE, nWE, and nR/B) to the memory device 1100 and may exchange data signals (e.g., DQ and DQS) with the memory device 1100. In detail, the memory device 1100 may receive a chip enable signal nCE from the memory controller 1200. When the chip enable signal nCE is in an enable state (e.g., at a low level), the memory device 1100 may exchange signals with the memory controller 1200.

The memory controller 1200 may send the chip enable signal nCE to the memory device 1100. The memory controller 1200 may exchange signals with the memory device 1100 through the chip enable signal nCE.

The memory controller 1200 may send the data signal DQ including the command CMD or the address ADDR to the memory device 1100 together with a write enable signal nWE toggling. The memory controller 1200 may send the data signal DQ including the command CMD to the memory device 1100 by sending a command latch enable signal CLE of an enable state and may send the data signal DQ including the address ADDR to the memory device 1100 by sending an address latch enable signal ALE of an enable state.

The memory controller 1200 may send a read enable signal nRE to the memory device 1100. The memory controller 1200 may receive the data strobe signal DQS from the memory device 1100 or may send the data strobe signal DQS to the memory device 1100.

The memory controller 1200 may generate the read enable signal nRE toggling and may send the read enable signal nRE to the memory device 1100, and the memory device 1100 may output the data "DATA" in response to the read enable signal nRE. For example, the memory controller 1200 may generate the read enable signal nRE that switches from a stationary state (e.g., a high level or a low level) to a toggling state before the data "DATA" are output. As such, the memory device 1100 may generate the data strobe signal DQS toggling based on the read enable signal nRE. The memory controller 1200 may receive the data signal DQ including the data "DATA" from the memory device 1100 together with the data strobe signal DQS toggling. The memory controller 1200 may obtain the data "DATA" from the data signal DQ based on the toggle timing of the data strobe signal DQS.

The memory controller 1200 may generate the data strobe signal DQS toggling, and the memory device 1100 may receive the data "DATA" in response to the data strobe signal DQS. For example, the memory controller 1200 may generate the data strobe signal DQS that switches from a stationary state (e.g., a high level or a low level) to a toggling state before sending the data "DATA". The memory controller 1200 may send the data signal DQ including the data "DATA" in synchronization with the toggle timing of the data strobe signal DQS to the memory device 1110.

The memory controller 1200 may receive a ready/busy signal nR/B from the memory device 1100. The memory controller 1200 may determine the status of the memory device 1100 based on the ready/busy signal nR/B.

In an embodiment, the memory controller 1200 may control an overall operation of the memory device 1100. For example, the memory controller 1200 may allow the memory device 1100 to perform the operations described with reference to FIGS. 1 to 13.

Figure 15:
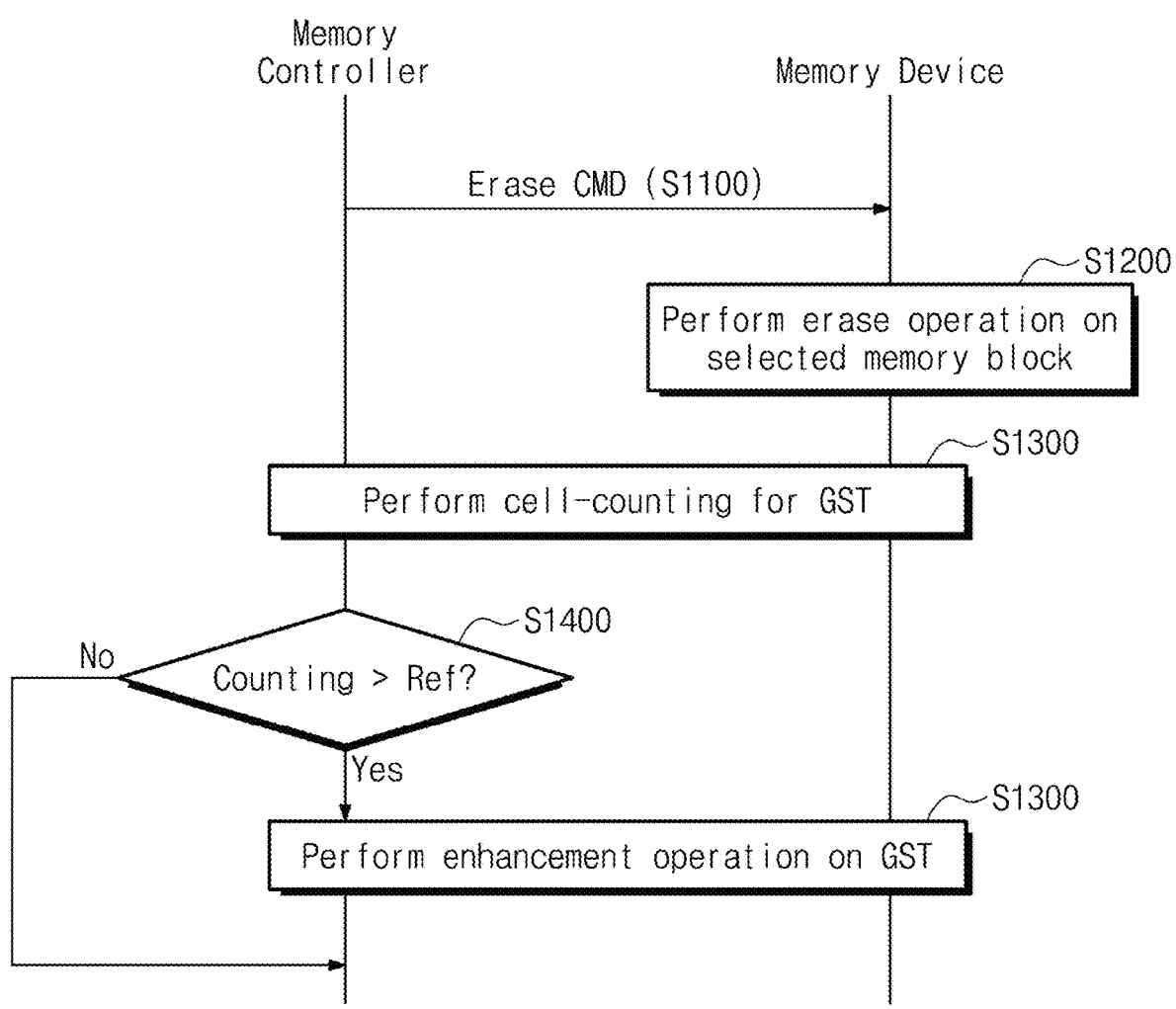
FIG. 15 is a flowchart illustrating an operation of a memory system of FIG. 14.

FIG. 15 is a flowchart illustrating an operation of a memory system of FIG. 14. Referring to FIGS. 14 and 15, in operation S1100, the memory controller 1200 may send an erase command Erase CMD to the memory device 1100. In operation S1200, the memory device 1100 may perform the erase operation on a selected memory block in response to the erase command Erase CMD.

In operation S1300, the memory controller 1200 and the memory device 1100 may perform a cell-counting operation on the ground selection transistors GST. For example, the memory controller 1200 may send a command for cell-counting to the memory device 1100. The memory device 1100 may perform the cell-counting operation on the ground selection transistors in response to the received command. The cell-counting operation may be performed by applying a reference voltage to a ground selection line connected with the ground selection transistors. In an embodiment, the reference voltage may be higher than the first verify voltage VVFY1 (e.g., a verify voltage used in the erase operation associated with the ground selection transistors). The memory device 1100 may send a result of the cell-counting operation to the memory controller 1200. In an embodiment, the cell-counting result may indicate the number of ground selection transistors having threshold voltages higher than the reference voltage from among the ground selection transistors (e.g., the number of ground selection transistors turned off).

In operation S1400, the memory controller 1200 may determine whether the cell-counting result (e.g., the off cell count) is greater than a reference value. For example, that the cell-counting result (e.g., the off cell count) is greater than the reference value may mean that the ground selection transistors GST are degraded.

In this case (e.g., in the case where the cell-counting result is greater than the reference value), in operation S1500, the memory controller 1200 and the memory device 1100 may perform the distribution enhancement operation on the ground selection transistors GST.

In an embodiment, the reference value may be differently set for each memory block of the memory device 1100. Alternatively, the reference value may be differently set for each cell string or plane of the same memory block.

In an embodiment, the memory device 100 may perform the distribution enhancement operation on any other unused cell transistors (e.g., DMC) in addition to the ground selection transistors GST. In this case, the memory controller 1200 may further perform the cell-counting operation on the unused cell transistors (e.g., DMC). In an embodiment, a reference voltage that is used in the cell-counting operation associated with the dummy memory cells DMC may be different from the reference voltage that is used in the cell-counting operation associated with the ground selection transistors GST. For example, the reference voltage that is used in the cell-counting operation associated with the dummy memory cells DMC may be higher than the reference voltage that is used in the cell-counting operation associated with the ground selection transistors GST.

Figure 16:
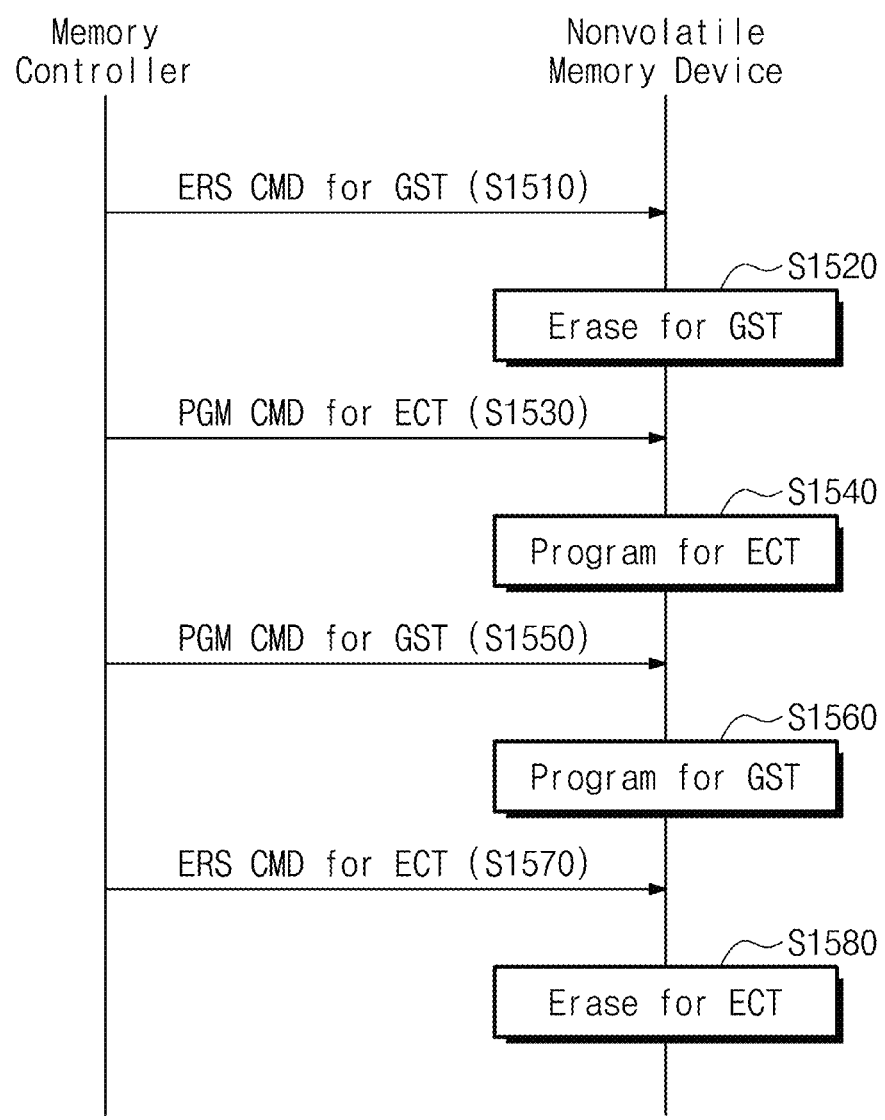
FIG. 16 is a flowchart illustrating operation S1500 of FIG. 15 in detail.

FIG. 16 is a flowchart illustrating operation S1500 of FIG. 15 in detail. Referring to FIGS. 14 to 16, the memory controller 1200 and the memory device 1100 may perform the distribution enhancement operation on the ground selection transistors GST through operation S1510 to operation S1580.

For example, in operation S1510, the memory controller 1200 may send an erase command for erasing the ground selection transistors GST to the memory device 1100. In operation S1520, the memory device 1100 may perform the erase operation on the ground selection transistors GST in response to the erase command for erasing the ground selection transistors GST. In an embodiment, operation S1520 is described through the bias condition of operation S110 of FIG. 6 and the erase operation for the ground selection transistors GST of FIG. 7, and thus, additional description will be omitted to avoid redundancy.

In operation S1530, the memory controller 1200 may send a program command for programming the erase control transistors ECT to the memory device 1100. In operation S1540, the memory device 1100 may perform the program operation on the erase control transistors ECT in response to the program command for programming the erase control transistors ECT. In an embodiment, operation S1540 is described through the bias condition of operation S120 of FIG. 6 and the program operation for the erase control transistors ECT of FIG. 7, and thus, additional description will be omitted to avoid redundancy.

In operation S1550, the memory controller 1200 may send a program command for programming the ground selection transistors GST to the memory device 1100. In operation S1560, the memory device 1100 may perform the program operation on the ground selection transistors GST in response to the program command for programming the ground selection transistors GST. In an embodiment, operation S1560 is described through the bias condition of operation S130 of FIG. 6 and the program operation for the ground selection transistors GST of FIG. 7, and thus, additional description will be omitted to avoid redundancy.

In operation S1570, the memory controller 1200 may send an erase command for erasing the erase control transistors ECT to the memory device 1100. In operation S1580, the memory device 1100 may perform the erase operation on the erase control transistors ECT in response to the erase command for erasing the erase control transistors ECT. In an embodiment, operation S1580 is described through the bias condition of operation S140 of FIG. 6 and the erase operation for the erase control transistors ECT of FIG. 7, and thus, additional description will be omitted to avoid redundancy.

As described above, the memory device 1100 may receive various commands from the memory controller 1200; in response to the received commands, the memory device 1100 may perform the erase operation on the ground selection transistors GST, may perform the program operation on the erase control transistors ECT, may perform the program operation on the ground selection transistors GST, and may perform the erase operation on the erase control transistors ECT. However, example embodiments are not limited thereto. For example, the memory controller 1200 may control the above operations of the memory controller 1200 by using a vendor command, a reserved command, or a given command.

In an embodiment, the memory controller 1200 may change various operation conditions of the memory device 1100 by using the set feature command. That is, the memory controller 1200 may perform operation S320 (e.g., a bias changing operation) of FIG. 10 by using the set feature command.

Figure 17:
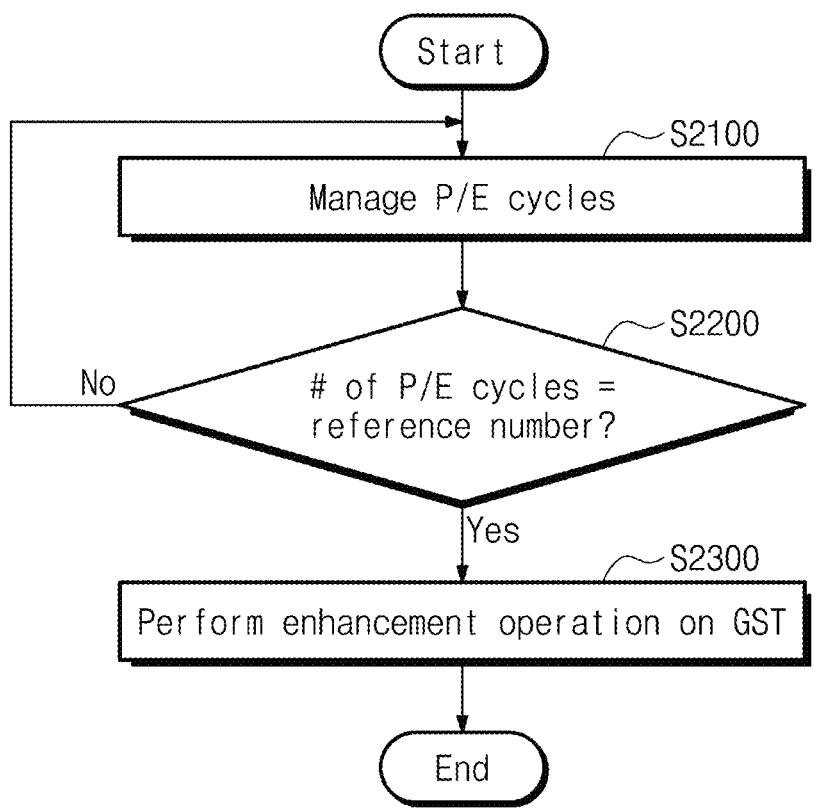
FIG. 17 is a flowchart illustrating an operation of a memory controller of FIG. 14.

FIG. 17 is a flowchart illustrating an operation of a memory controller of FIG. 14. Referring to FIGS. 14 and 17, in operation S2100, the memory controller 1200 may manage program/erase (P/E) cycles of the memory device 1100. For example, the memory controller 1200 may manage the P/E cycles of each of a plurality of memory blocks included in the memory device 1100.

In operation S2200, the memory controller 1200 may determine whether the number of P/E cycles of a specific memory block is equal to a reference value (e.g., reaches the reference value).

When it is determined that the number of P/E cycles of the specific memory block reaches the reference value, in operation S2300, the memory controller 1200 may perform the program operation on the ground selection transistors GST. In an embodiment, the memory controller 1200 may perform operation S2300 based on the method described with reference to FIG. 16.

In an embodiment, the reference value that is compared with the number of P/E cycles may include one reference value or a plurality of reference values. That is, the memory controller 1200 may perform the distribution enhancement operation on the ground selection transistors GST at least once or more during the whole lifetime of the memory device 1100.

In the above embodiments, the memory controller 1200 may perform the distribution enhancement operation on the ground selection transistors GST when (and/or if) the number of P/E cycles of the memory device 1100 reaches the reference value, but example embodiments are not limited thereto. For example, in the case where a program fail, a read error, or a read reclaim operation associated with a specific memory block of the memory device 1100 occurs as much as the given number of times, the memory controller 1200 may perform the cell-counting operation on the specific memory block and may perform the distribution enhancement operation based on a cell-counting result.

As described above, according to embodiments of the present disclosure, to enhance the reliability of operation, a memory device may perform the distribution enhancement operation on ground selection transistors of a memory block or cell transistors (e.g., dummy memory cells or string selection transistors) connected with unused word lines.

Figure 18:
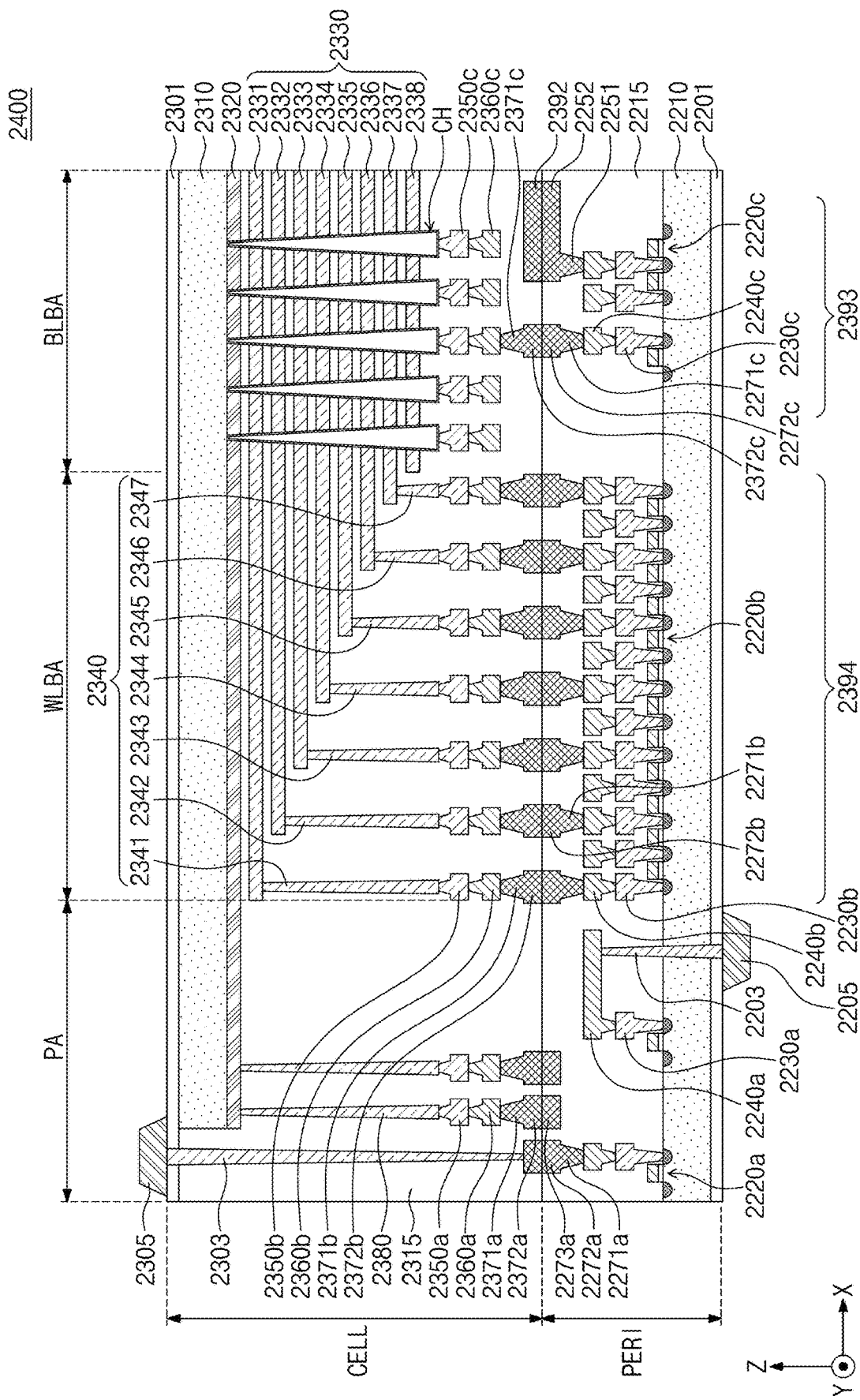
FIG. 18 is a cross-sectional view illustrating a memory device according to an embodiment of the present disclosure.

FIG. 18 is a diagram illustrating a memory device 2400 according to another example embodiment. Referring to FIG. 18, a memory device 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 18, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word lines 2331 to 2338 (e.g., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CH may extend in a direction (a Z-axis direction), perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an example embodiment, the bit line 2360c may extend in a first direction (a Y-axis direction), parallel to the upper surface of the second substrate 2310.

In an example embodiment illustrated in FIG. 18, an area in which the channel structure CH, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. The bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393. In an example embodiment, a program operation may be executed based on a page unit as write data of the page-unit is stored in the page buffer 2393, and a read operation may be executed based on a sub-page unit as read data of the sub-page unit is stored in the page buffer 2393. Also, in the program operation and the read operation, units of data transmitted through bit lines may be different from each other.

In the word line bonding area WLBA, the plurality of word lines 2330 may extend in a second direction (an X-axis direction), parallel to the upper surface of the second substrate 2310 and perpendicular to the first direction, and may be connected to a plurality of cell contact plugs 2341 to 2347 (e.g., 2340). The plurality of word lines 2330 and the plurality of cell contact plugs 2340 may be connected to each other in pads provided by at least a portion of the plurality of word lines 2330 extending in different lengths in the second direction. A first metal layer 2350b and a second metal layer 2360b may be connected to an upper portion of the plurality of cell contact plugs 2340 connected to the plurality of word lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b of the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input-output pads 2205 and 2305 may be disposed in the external pad bonding area PA. Referring to FIG. 18, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 18, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303. In the example embodiment, the second input-output pad 2305 is electrically connected to a circuit element 2220a.

According to embodiments, the second substrate 2310 and the common source line 2320 may not be disposed in an area in which the second input-output contact plug 2303 is disposed. Also, the second input-output pad 2305 may not overlap the word lines 2330 in the third direction (the Z-axis direction). Referring to FIG. 18, the second input-output contact plug 303 may be separated from the second substrate 2310 in a direction, parallel to the upper surface of the second substrate 2310, and may pass through the interlayer insulating layer 2315 of the cell region CELL to be connected to the second input-output pad 2305.

According to embodiments, the first input-output pad 2205 and the second input-output pad 2305 may be selectively formed. For example, the memory device 2400 may include only the first input-output pad 2205 disposed on the first substrate 2210 or the second input-output pad 2305 disposed on the second substrate 2310. Alternatively, the memory device 2400 may include both the first input-output pad 2205 and the second input-output pad 2305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2400 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

In an embodiment, the memory device 2400 of FIG. 18 is illustrated as not including an erase control line and an erase control transistor, but example embodiments are not limited thereto. The memory device 2400 may further include an erase control line and an erase control transistor and may operate based on the operation method described with reference to FIGS. 1 to 13.

Figure 19:
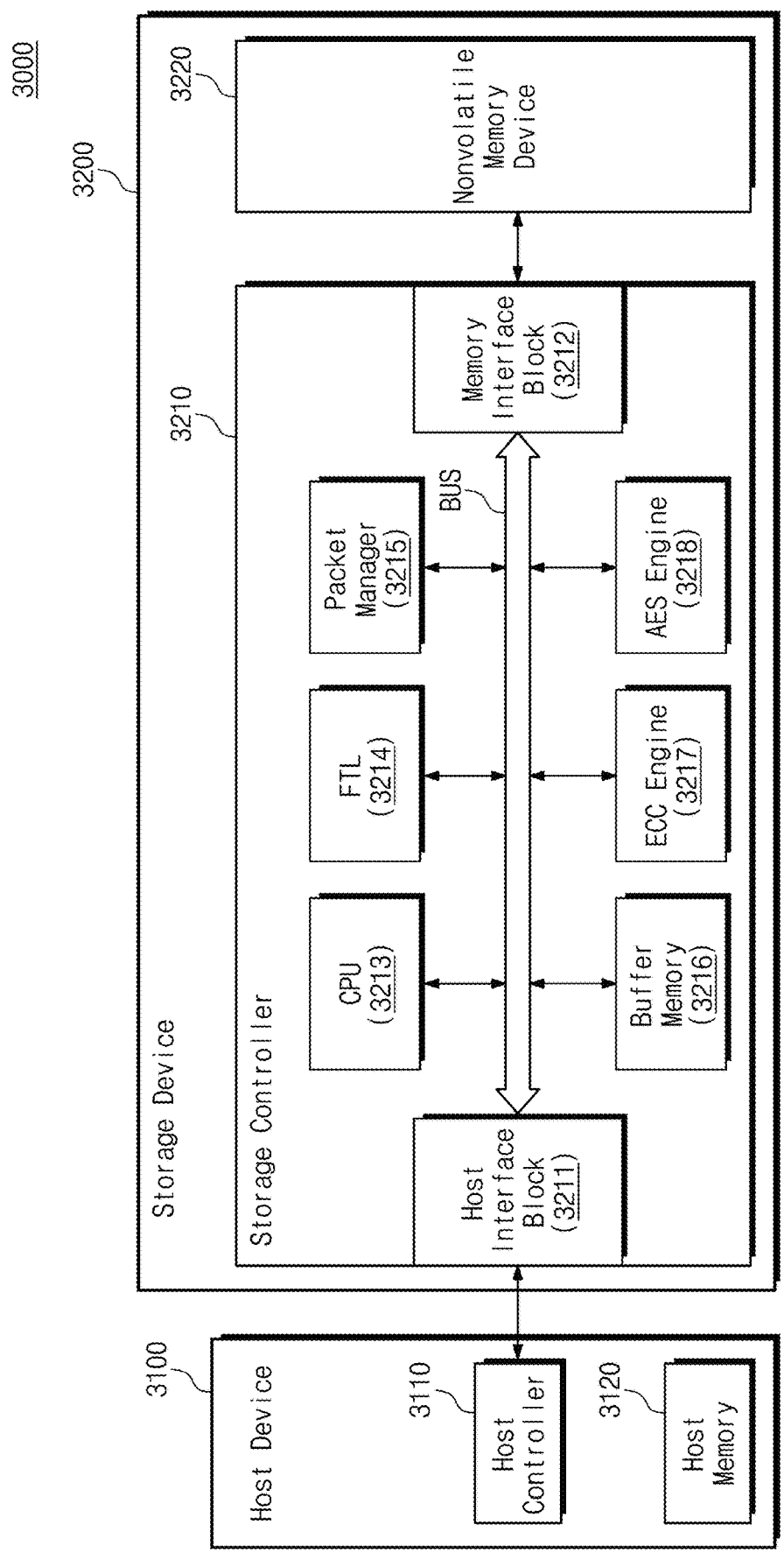
FIG. 19 is a block diagram illustrating a host-storage system according to an embodiment of the present disclosure.

FIG. 19 is a block diagram of a host storage system according to an example embodiment.

The host storage system 3000 may include a host 3100 and a storage device 3200. Further, the storage device 3200 may include a storage controller 3210 and an NVM 3220. According to an example embodiment, the host 3100 may include a host controller 3110 and a host memory 3120. The host memory 3120 may serve as a buffer memory configured to temporarily store data to be transmitted to the storage device 3200 or data received from the storage device 3200.

The storage device 3200 may include storage media configured to store data in response to requests from the host 3100. As an example, the storage device 3200 may include at least one of an SSD, an embedded memory, and a removable external memory. When the storage device 3200 is an SSD, the storage device 3200 may be a device that conforms to an NVMe standard. When the storage device 3200 is an embedded memory or an external memory, the storage device 3200 may be a device that conforms to a UFS standard or an eMMC standard. Each of the host 3100 and the storage device 3200 may generate a packet according to an adopted standard protocol and transmit the packet.

When the NVM 3220 of the storage device 3200 includes a flash memory, the flash memory may include a 2D NAND memory array or a 3D (or vertical) NAND (VNAND) memory array. As another example, the storage device 3200 may include various other kinds of NVMs. For example, the storage device 3200 may include magnetic RAM (MRAM), spin-transfer torque MRAM, conductive bridging RAM (CBRAM), ferroelectric RAM (FRAM), PRAM, RRAM, and various other kinds of memories.

According to an embodiment, the host controller 3110 and the host memory 3120 may be implemented as separate semiconductor chips. Alternatively, in some embodiments, the host controller 3110 and the host memory 3120 may be integrated in the same semiconductor chip. As an example, the host controller 3110 may be any one of a plurality of modules included in an application processor (AP). The AP may be implemented as a System on Chip (SoC). Further, the host memory 3120 may be an embedded memory included in the AP or an NVM or memory module located outside the AP.

The host controller 3110 may manage an operation of storing data (e.g., write data) of a buffer region of the host memory 3120 in the NVM 3220 or an operation of storing data (e.g., read data) of the NVM 3220 in the buffer region.

The storage controller 3210 may include a host interface 3211, a memory interface 3212, and a CPU 3213. Further, the storage controllers 3210 may further include a flash translation layer (FTL) 3214, a packet manager 3215, a buffer memory 3216, an error correction code (ECC) engine 3217, and an advanced encryption standard (AES) engine 3218. The storage controllers 3210 may further include a working memory (not shown) in which the FTL 3214 is loaded. The CPU 3213 may execute the FTL 3214 to control data write and read operations on the NVM 3220.

The host interface 3211 may transmit and receive packets to and from the host 3100. A packet transmitted from the host 3100 to the host interface 3211 may include a command or data to be written to the NVM 3220. A packet transmitted from the host interface 3211 to the host 3100 may include a response to the command or data read from the NVM 3220. The memory interface 3212 may transmit data to be written to the NVM 3220 to the NVM 3220 or receive data read from the NVM 3220. The memory interface 3212 may be configured to comply with a standard protocol, such as Toggle or open NAND flash interface (ONFI).

The FTL 3214 may perform various functions, such as an address mapping operation, a wear-leveling operation, and a garbage collection operation. The address mapping operation may be an operation of converting a logical address received from the host 3100 into a physical address used to actually store data in the NVM 3220. The wear-leveling operation may be a technique for limiting and/or preventing excessive deterioration of a specific block by allowing blocks of the NVM 3220 to be uniformly used. As an example, the wear-leveling operation may be implemented using a firmware technique that balances erase counts of physical blocks. The garbage collection operation may be a technique for ensuring usable capacity in the NVM 3220 by erasing an existing block after copying valid data of the existing block to a new block.

The packet manager 3215 may generate a packet according to a protocol of an interface, which consents to the host 3100, or parse various types of information from the packet received from the host 3100. In addition, the buffer memory 3216 may temporarily store data to be written to the NVM 3220 or data to be read from the NVM 3220. Although the buffer memory 3216 may be a component included in the storage controllers 3210, the buffer memory 3216 may be outside the storage controllers 3210.

The ECC engine 3217 may perform error detection and correction operations on read data read from the NVM 3220. More specifically, the ECC engine 3217 may generate parity bits for write data to be written to the NVM 3220, and the generated parity bits may be stored in the NVM 3220 together with write data. During the reading of data from the NVM 3220, the ECC engine 3217 may correct an error in the read data by using the parity bits read from the NVM 3220 along with the read data, and output error-corrected read data.

The AES engine 3218 may perform at least one of an encryption operation and a decryption operation on data input to the storage controllers 3210 by using a symmetric-key algorithm.

In an embodiment, the storage device 3200 may operate based on the operation method described with reference to FIGS. 1 to 17.

According to the present disclosure, a threshold voltage distribution of ground selection transistors or any other unused cell transistors may be enhanced. Accordingly, an operation method of a memory device with improved reliability and/or an operation method of a memory controller controlling the memory device are provided.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the present disclosure has been described with reference to embodiments thereof, it will be apparent to those of ordinary skill in the art that various changes and modifications may be made thereto without departing from the spirit and scope of inventive concepts in the present disclosure as set forth in the following claims.

What is claimed is:

1. An operation method of a memory device that includes a memory block including a plurality of cell transistors stacked in a direction perpendicular to a substrate, the operation method comprising:
performing a first erase operation on a ground selection transistor of the plurality of cell transistors, the plurality of cell transistors including the ground selection transistor and an erase control transistor, the erase control transistor between the substrate and the ground selection transistor;
after the first erase operation, performing a first program operation on the erase control transistor;
after the first program operation, performing a second program operation on the ground selection transistor; and
after the second program operation, performing a second erase operation on the erase control transistor.

2. The operation method of claim 1, wherein the performing the first erase operation on the ground selection transistor includes:
applying an erase voltage to a common source line, applying a first word line erase voltage to a ground selection line connected with the ground selection transistor, applying the first word line erase voltage to an erase control line connected with the erase control transistor, and floating a plurality of lines connected with remaining cell transistors of the plurality of cell transistors; and
applying a first erase verify voltage to the ground selection line.

3. The operation method of claim 2, wherein the performing the first program operation on the erase control transistor includes:
applying a first program voltage to the erase control line and applying a first pass voltage to the ground selection line and the plurality of lines connected with the remaining cell transistors of the plurality of cell transistors; and
applying a first program verify voltage to the erase control line.

4. The operation method of claim 3, wherein the first program verify voltage is higher than the first erase verify voltage.

5. The operation method of claim 3, wherein the performing the second program operation on the ground selection transistor includes:
applying a second program voltage to the ground selection line, applying a first off voltage to the erase control line, and applying a second pass voltage to the plurality of lines connected with the remaining cell transistors of the plurality of cell transistors, the first off voltage being lower than or equal to the first program verify voltage; and
applying a second program verify voltage to the ground selection line.

6. The operation method of claim 5, wherein the performing the second erase operation on the erase control transistor includes:
applying the erase voltage to the common source line, applying a second word line erase voltage to the erase control line, and floating the ground selection line and the plurality of lines connected with the remaining cell transistors of the plurality of cell transistors; and
applying a second erase verify voltage to the erase control line.

7. The operation method of claim 6, wherein the second erase verify voltage is lower than or equal to the second program verify voltage.

8. The operation method of claim 1, wherein the performing the first erase operation on the ground selection transistor includes:
applying an erase voltage to a common source line, applying a first word line erase voltage to a ground selection line connected with the ground selection transistor, applying the first word line erase voltage to an erase control line connected with the erase control transistor, and applying the first word line erase voltage to a dummy word line connected with a dummy memory cell of the plurality of cell transistors, and floating a plurality of lines connected with remaining cell transistors of the plurality of cell transistors; and
applying a first erase verify voltage to the ground selection line,
wherein the dummy memory cell is adjacent to the ground selection transistor.

9. The operation method of claim 1, further comprising:
after the performing the second erase operation on the erase control transistor, performing a third erase operation on a dummy memory cell adjacent to the erase control transistor, the dummy memory cell among the plurality of cell transistors; and
performing a third program operation on the dummy memory cell.

10. The operation method of claim 1, further comprising:
before the performing the first erase operation on the ground selection transistor, performing an erase operation on memory cells between the ground selection transistor of the plurality of cell transistors and a bit line.

11. An operation method of a memory device that includes a memory block including a plurality of lines stacked in a direction perpendicular to a substrate, the operation method comprising:
applying a first erase voltage to a common source line and applying a first word line erase voltage to a ground selection line of the plurality of lines, the plurality of lines including the ground selection line and an erase control line, the erase control line between the ground selection line and the substrate;
applying a first erase verify voltage to the ground selection line;
applying a first program voltage to the erase control line;

applying a first program verify voltage to the erase control line;
applying a second program voltage to the ground selection line;
applying a second program verify voltage to the ground selection line;
applying a second erase voltage to the common source line and applying a second word line erase voltage to the erase control line; and
applying a second erase verify voltage to the erase control line.

12. The operation method of claim 11, further comprising:
applying a first off voltage to the erase control line while the applying the second program voltage to the ground selection line is performed, wherein
the first off voltage is lower than or equal to the first program verify voltage.

13. The operation method of claim 11, wherein the second erase verify voltage is lower than or equal to the second program verify voltage.

14. The operation method of claim 11,
wherein the memory block includes a plurality of cell strings connected in common with one bit line,
wherein the ground selection line is connected with ground selection transistors respectively included in some of the plurality of cell strings, and
wherein the erase control line is connected with erase control transistors respectively included in the plurality of cell strings.

15. The operation method of claim 11, further comprising:
applying the first word line erase voltage to a dummy word line of the plurality of lines while the applying the first word line erase voltage to the ground selection line is performed, the dummy word line being adjacent to the ground selection line; and
applying the first erase verify voltage to the dummy word line while the applying the first erase verify voltage to the ground selection line is performed.

16. The operation method of claim 15, further comprising:
applying a third program voltage to the dummy word line; and
applying a third program verify voltage to the dummy word line.

17. The operation method of claim 11, further comprising:
applying a third erase voltage to the common source line and applying a third word line erase voltage to a dummy word line of the plurality of lines, the dummy word line being adjacent to the ground selection line from among the plurality of lines;
applying a third erase verify voltage to the dummy word line; and
applying a third program voltage to the dummy word line; and
applying a third program verify voltage to the dummy word line.

18. An operation method of a memory controller that is configured to control a memory device including a plurality of cell transistors stacked in a direction perpendicular to a substrate, the operation method comprising:
sending a first command to the memory device using the memory controller, the first command for controlling the memory device to perform a cell-counting operation associated with ground selection transistors of the plurality of cell transistors;
receiving a cell-counting result for the ground selection transistors, the memory controller receiving the cell-counting result from the memory device; and
performing a distribution enhancement operation on the ground selection transistors based on the cell-counting result, wherein
the distribution enhancement operation includes
sending a first erase command to the memory device using the memory controller, the first erase command for controlling the memory device to erase the ground selection transistors of the memory device,
sending a first program command to the memory device using the memory controller, the first program command for controlling the memory device to program erase control transistors, the erase control transistors between the ground selection transistors and the substrate of the memory device, the plurality of cell transistors including the ground selection transistors and the erase control transistors,
sending a second program command to the memory device using the memory controller, the second program command for controlling the memory device to program the ground selection transistors of the memory device, and
sending a second erase command to the memory device using the memory controller, the second erase command for controlling the memory device to erase the erase control transistors of the memory device.

19. The operation method of claim 18, further comprising:
sending a third erase command to the memory device using the memory controller, the third erase command for controlling the memory device to erase memory cells of the plurality of cell transistors before the sending the first command to the memory device using the memory controller is performed.

20. The operation method of claim 18, further comprising:
determining whether a number of program/erase cycles of the memory device is equal to a reference value using the memory controller, wherein
the memory controller performs the sending the first command the memory device if the number of program/erase cycles is equal to the reference value.

\* \* \* \* \*